(12) United States Patent
    Kim et al.

(10) Patent No.: US 12,696,562 B2
(45) Date of Patent: Jul. 28, 2026

(54) IMAGE SENSOR

(71) Applicant: SAMSUNG ELECTRONICS CO., LTD., Suwon-si (KR)

(72) Inventors: Yunhyeok Kim, Suwon-si (KR); Hwanwoong Kim, Suwon-si (KR); Hyuncheol Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 334 days.

(21) Appl. No.: 18/388,277

(22) Filed: Nov. 9, 2023

(65) Prior Publication Data

US 2024/0162257 A1    May 16, 2024

(30) Foreign Application Priority Data

Nov. 10, 2022    (KR) ........................ 10-2022-0149350

(51) Int. Cl.
H10F 39/00 (2025.01)
H10F 39/18 (2025.01)

(52) U.S. Cl.
CPC ..... H10F 39/80373 (2025.01); H10F 39/014 (2025.01); H10F 39/182 (2025.01)

(58) Field of Classification Search
CPC ............. H10F 39/80373; H10F 39/014; H10F 39/182; H10F 39/18; H10F 39/802; H10F 39/807; H10F 39/813; H10F 39/8037; H10F 39/811
See application file for complete search history.

(56) References Cited

U.S. PATENT DOCUMENTS

| | | | |
|---|---|---|---|
| 7,535,037 B2 | 5/2009 | Lyu | |
| 8,575,035 B2 | 11/2013 | Chen et al. | |
| 10,804,302 B2 | 10/2020 | Tian | |
| 11,393,854 B2 * | 7/2022 | Kim ..................... H10F 39/802 | |
| 2015/0115337 A1 | 4/2015 | Yang et al. | |
| 2019/0172857 A1 | 6/2019 | Lin et al. | |
| 2021/0305298 A1 | 9/2021 | Hu et al. | |

FOREIGN PATENT DOCUMENTS

| | | |
|---|---|---|
| KR | 10-2006-0026262 A | 3/2006 |
| KR | 10-2006-0034926 A | 4/2006 |

* cited by examiner

*Primary Examiner* — David Vu
(74) *Attorney, Agent, or Firm* — Fish & Richardson P.C.

(57) ABSTRACT

An image sensor including a substrate having a pixel region, a floating diffusion region in the pixel region of the substrate, a plurality of photoelectric conversion regions around the floating diffusion region in the substrate, a plurality of transmission gates adjacent to the plurality of photoelectric conversion regions, respectively, each including a first buried gate extending to the inside of the substrate, a second buried gate apart from the first buried gate and extending to the inside of the substrate, and a gate connection between the first buried gate and the second buried gate, and a plurality of spacers each on at least parts of side walls of each of the plurality of transmission gates, wherein each of the plurality of spacers is between the side walls of each of the plurality of transmission gates and the floating diffusion region in a plan view.

20 Claims, 25 Drawing Sheets

A1-A1'

A1–A1'

A1–A1'

A1-A1'

A1–A1'

A1-A1'

A1–A1'

A1-A1'

A1–A1'

IMAGE SENSOR

CROSS-REFERENCE TO RELATED APPLICATION

Korean Patent Application No. 10-2022-0149350, filed on Nov. 10, 2022, in the Korean Intellectual Property Office, is incorporated by reference herein in its entirety.

BACKGROUND

1. Field

An image sensor is disclosed.

2. Description of the Related Art

The image sensor converts an optical image signal into an electrical signal.

SUMMARY

Embodiments are directed to an image sensor including a substrate having a pixel region, a floating diffusion region in the pixel region of the substrate, a plurality of photoelectric conversion regions around the floating diffusion region in the substrate, a plurality of transmission gates adjacent to the plurality of photoelectric conversion regions, respectively, each including a first buried gate extending to the inside of the substrate, a second buried gate apart from the first buried gate and extending to the inside of the substrate, and a gate connection between the first buried gate and the second buried gate, and a plurality of spacers each on at least parts of side walls of each of the plurality of transmission gates, wherein each of the plurality of spacers are between the side walls of each of the plurality of transmission gates and the floating diffusion region in a plan view.

Embodiments are directed to an image sensor including a substrate having a pixel region, a floating diffusion region in the pixel region of the substrate, a plurality of photoelectric conversion regions around the floating diffusion region in the substrate, a plurality of transmission gates adjacent to the plurality of photoelectric conversion regions, respectively, each including a first buried gate extending to the inside of the substrate, a second buried gate apart from the first buried gate and extending to the inside of the substrate, and a gate connection between the first buried gate and the second buried gate, and a plurality of spacers each on at least parts of side walls of each of the plurality of transmission gates and each having a first width in a first horizontal direction, wherein the floating diffusion region is apart from the first buried gate by a first distance and the first distance is substantially equal to the first width.

Embodiments are directed to an image sensor including a substrate having a pixel region, a floating diffusion region in the pixel region of the substrate, a plurality of photoelectric conversion regions around the floating diffusion region in the substrate, a plurality of transmission gates adjacent to the plurality of photoelectric conversion regions, respectively, each including a first buried gate in a first buried gate opening extending to the inside of the substrate, a second buried gate apart from the first buried gate and in a second buried gate opening extending to the inside of the substrate, and a gate connection between the first buried gate and the second buried gate, a plurality of spacers each on at least parts of side walls of each of the plurality of transmission gates, and an intrinsic semiconductor region in the substrate and between the floating diffusion region and each of the plurality of transmission gates, wherein the intrinsic semiconductor region vertically overlaps the plurality of spacers and the gate connection.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
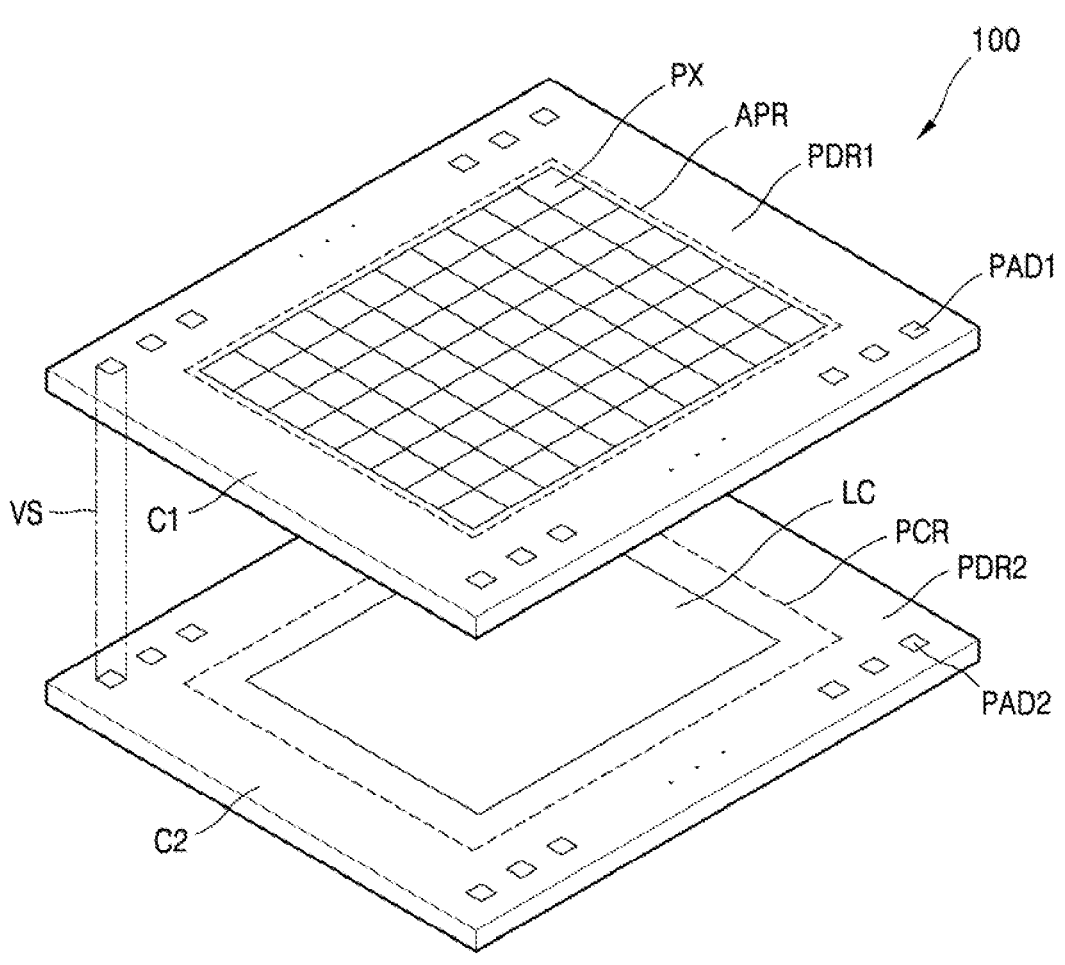
FIG. 1 is a perspective diagram of an image sensor according to an example embodiment.
Figure 2:
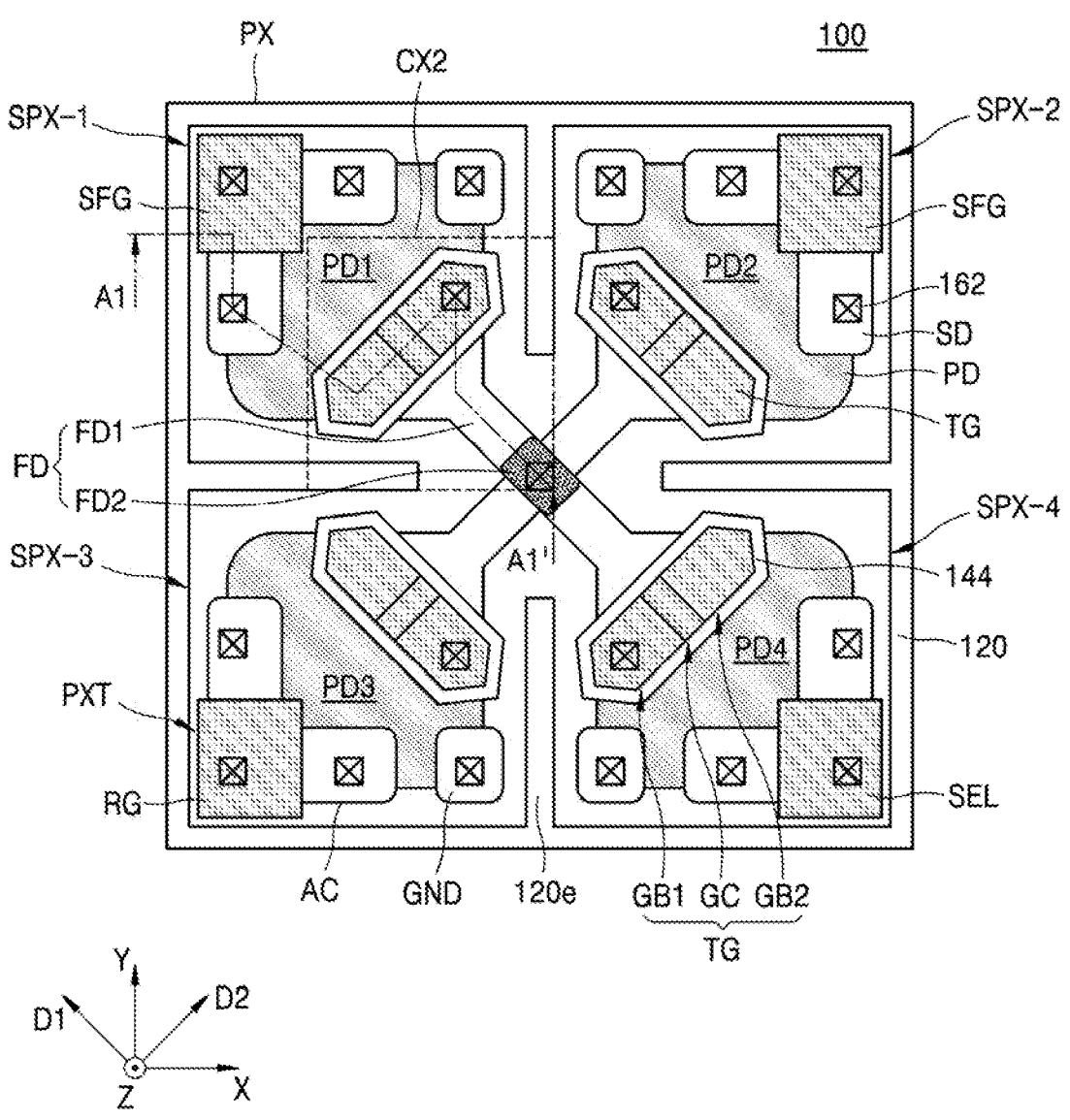
FIG. 2 is an enlarged layout of a pixel PX of FIG. 1.
Figure 3:
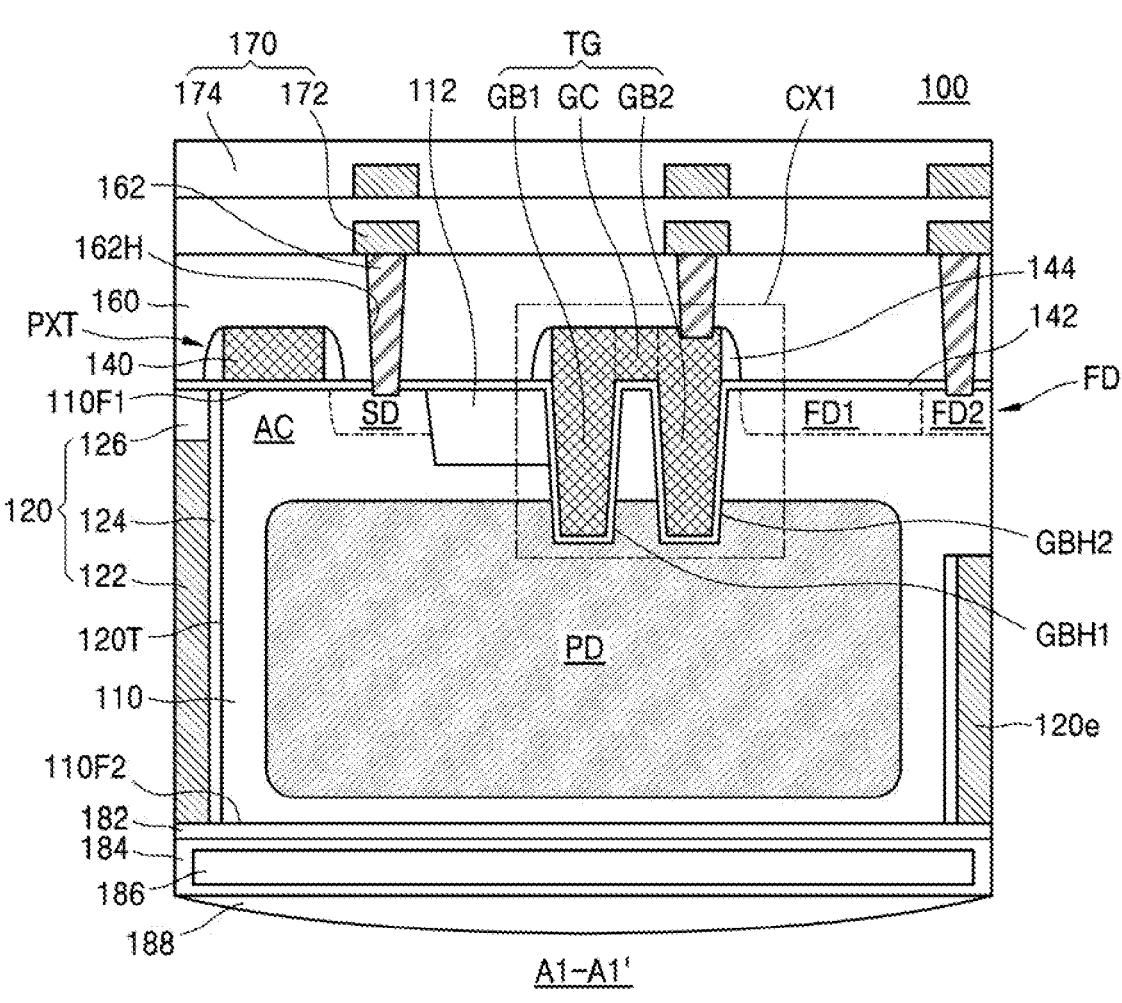
FIG. 3 is a cross-sectional view taken along the line A1-A1' of FIG. 2.
Figure 4:
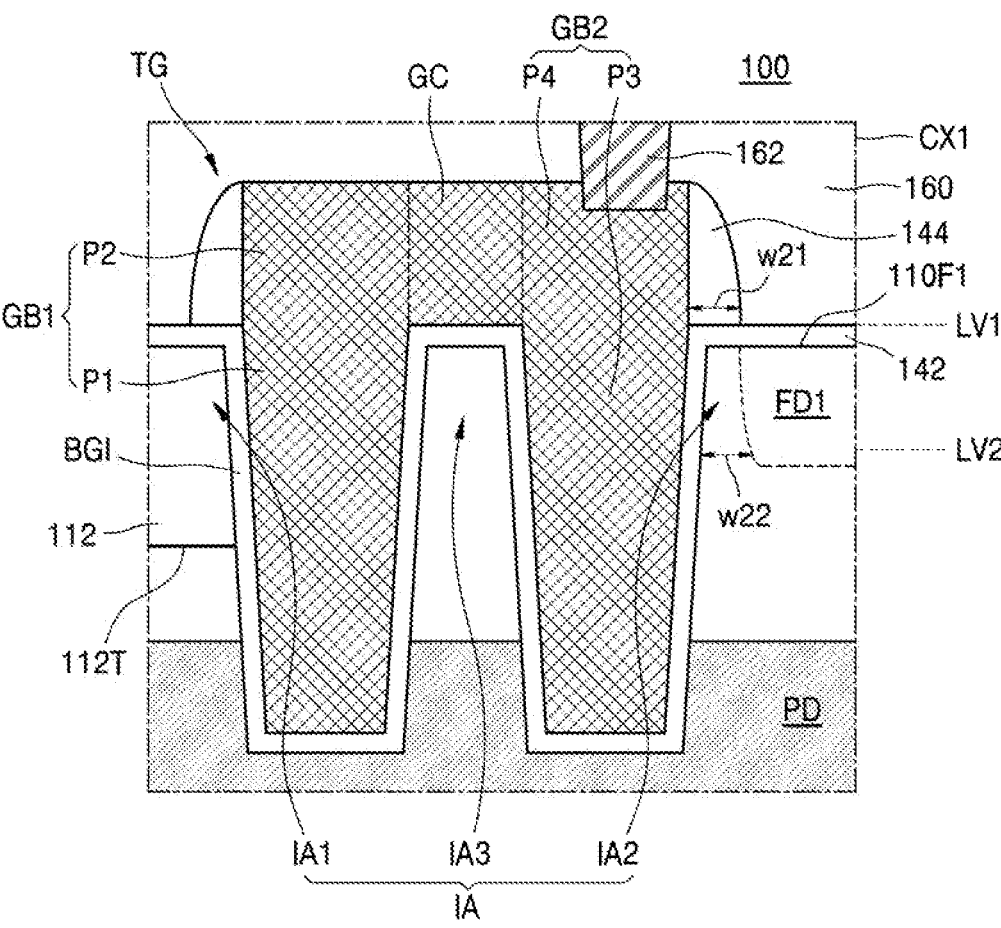
FIG. 4 is an enlarged view of the portion CX1 of FIG. 3.
Figure 5:
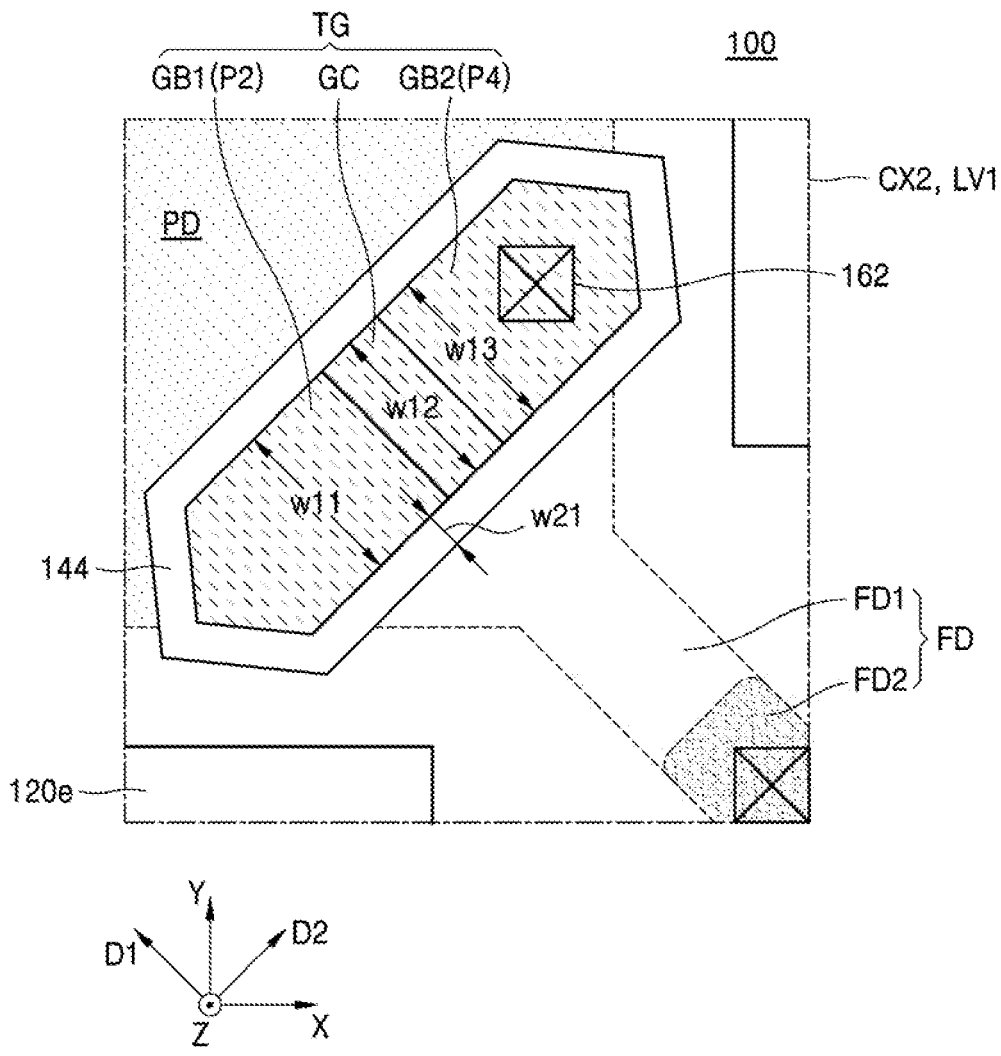
FIG. 5 is a plan view of the portion CX2 of FIG. 2 at the first vertical level LV1 of FIG. 4.
Figure 6:
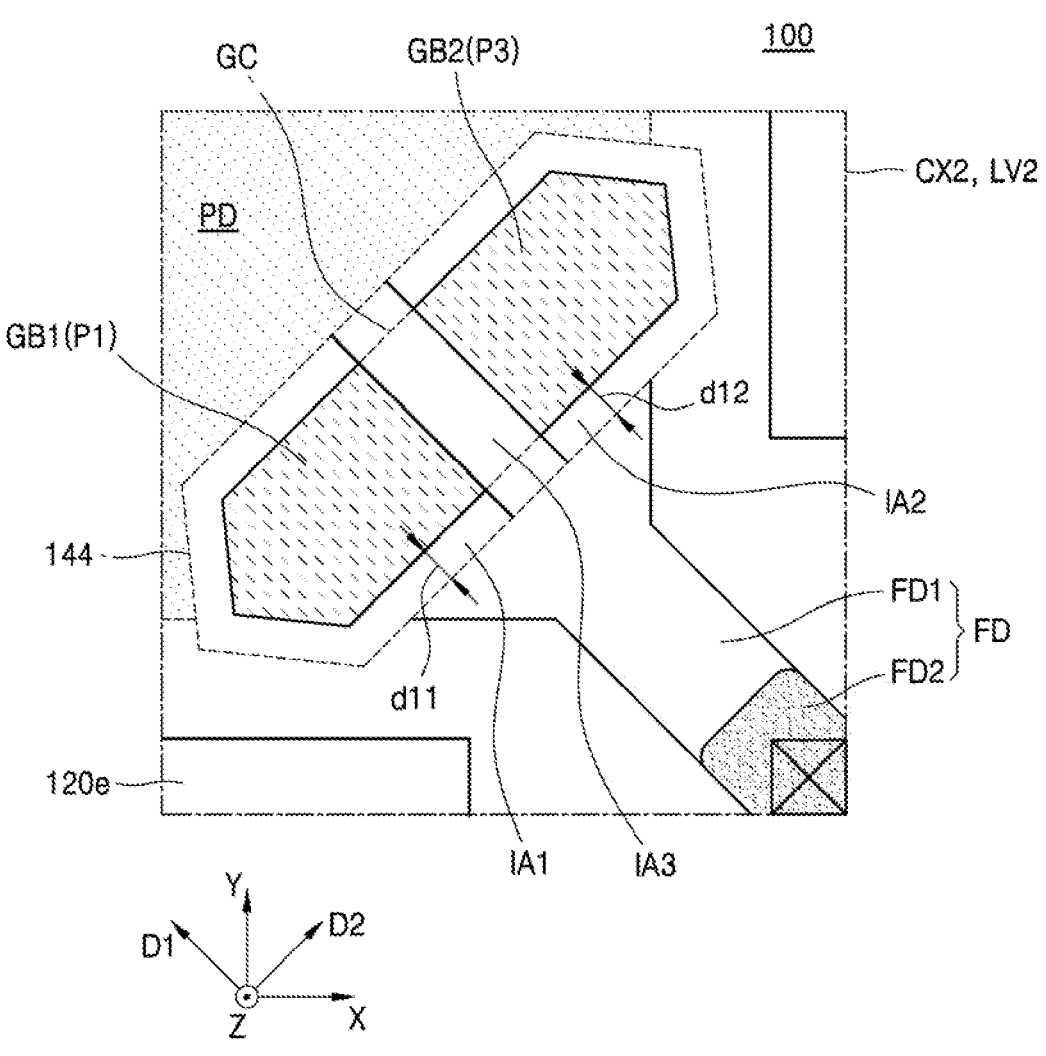
FIG. 6 is a plan view of the portion CX2 of FIG. 2 at the second vertical level LV2 of FIG. 4.

FIG. 1 is a perspective diagram of an image sensor 100 according to an example embodiment. FIG. 2 is an enlarged layout of a pixel PX of FIG. 1. FIG. 3 is a cross-sectional view taken along the line A1-A1' of FIG. 2. FIG. 4 is an enlarged view of the portion CX1 of FIG. 3. FIG. 5 is a plan view of the portion CX2 of FIG. 2 at the first vertical level LV1 of FIG. 4. FIG. 6 is a plan view of the portion CX2 of FIG. 2 at the second vertical level LV2 of FIG. 4. In FIG. 3, representation of a part of a second chip C2 is omitted for convenience of illustration.

Referring to FIGS. 1 to 6, the image sensor 100 may be a stacked image sensor including a first chip C1 and the second chip C2 stacked on one another in a vertical direction. The first chip C1 may include an active pixel region APR and a first pad region PDR1, and the second chip C2 may include a peripheral circuit region PCR and a second pad region PDR2.

A plurality of first pads PAD1 of the first pad region PDR1 may transmit and receive an electrical signal to and from an external device. The peripheral circuit region PCR may include a logic circuit block LC and a plurality of complementary metal-oxide-semiconductor (CMOS) transistors. The peripheral circuit region PCR may provide a constant signal to each active pixel PX of the active pixel region APR or may control an output signal from each active pixel PX. The plurality of first pads PAD1 of the first pad region PDR1 may be electrically connected to a plurality of second pads PAD2 of the second pad region PDR2 by a via structure VS.

The active pixel region APR includes a plurality of pixels PX, and a plurality of photoelectric conversion regions PD may be arranged in each of the plurality of pixels PX. In the active pixel region APR, the plurality of pixels PX may be arranged in a matrix in rows and columns in a first direction X parallel to a top surface of a substrate 110 and a second direction Y perpendicular to the first direction X and parallel to the top surface of the substrate 110.

The substrate 110 may include a first surface 110F1 and a second surface 110F2 opposite to each other. Here, for convenience sake, a surface of the substrate 110, on which a color filter 186 is arranged, is referred to as the second surface 110F2, and a surface opposite to the second surface 110F2 is referred to as the first surface 110F1.

In embodiments, the substrate 110 may include a p-type substrate. In an implementation, the substrate 110 may include silicon (Si), germanium (Ge), silicon germanium (SiGe), silicon carbide (SiC), gallium arsenide (GaAs), indium arsenide (InAs), or indium phosphide (InP). In an implementation, the substrate 110 may include a p-type silicon substrate. In embodiments, the substrate 110 may include a p-type bulk substrate and a p-type or n-type epitaxial layer grown thereon. In other embodiments, the substrate 110 may include an n-type bulk substrate and a p-type or n-type epitaxial layer grown thereon. Alternatively, the substrate 110 may include an organic plastic substrate. A well region may be in the substrate 110 adjacent to the first surface 110F1 of the substrate 110. The well region may include a region doped with p-type impurities. As used herein, the term "or" is not an exclusive term, e.g., "A or B" would include A, B, or A and B.

In the active pixel region APR, the plurality of pixels PX may be arranged in a matrix in the substrate 110. The plurality of photoelectric conversion regions PD may be in each of the plurality of pixels PX. In the plurality of photoelectric conversion regions PD, light incident from the second surface 110F2 of the substrate 110 may be converted into an electrical signal. The plurality of photoelectric conversion regions PD may include n-type impurities.

In the active pixel region APR, a pixel element isolation layer 120 may be in the substrate 110, and the plurality of pixels PX may be defined by the pixel element isolation layer 120. The plurality of photoelectric conversion regions PD may be in one pixel PX surrounded by the pixel element isolation layer 120. In an implementation, as illustrated in FIG. 2, one pixel PX may include first to fourth sub-pixel regions SPX-1, SPX-2, SPX-3, and SPX-4, and first to fourth photoelectric conversion regions PD1, PD2, PD3, and PD4 may be in the first to fourth sub-pixel regions SPX-1, SPX-2, SPX-3, and SPX-4, respectively. A floating diffusion region FD may be in a central region of one pixel PX. The first to fourth sub-pixel regions SPX-1, SPX-2, SPX-3, and SPX-4 may share one floating diffusion region FD, and the first to fourth photoelectric conversion regions PD1, PD2, PD3, and PD4 may be adjacent to the floating diffusion region FD.

The pixel element isolation layer 120 may be in a pixel trench 120T passing through the substrate 110 from the first surface 110F1 of the substrate 110 to the second surface 110F2 of the substrate 110. The pixel element isolation layer 120 may include an insulating layer 122 conformally formed on a side wall of the pixel trench 120T, a conductive layer 124 filling the pixel trench 120T on the insulating layer 122, and an upper insulating layer 126.

In embodiments, the insulating layer 122 may include a metal oxide such as hafnium oxide, aluminum oxide, or tantalum oxide. In this case, the insulating layer 122 may function as a negative fixed charge layer. In other embodiments, the insulating layer 122 may include an insulating material such as silicon oxide, silicon nitride, or silicon oxynitride. The conductive layer 124 may include at least one of doped polysilicon, a metal, metal silicide, metal nitride, and a metal-containing layer.

In embodiments, the pixel element isolation layer 120 may include lateral extensions 120e extending in the first direction X and the second direction Y toward the center of the pixel PX. The lateral extensions 120e may each be between two sub-pixel regions SPX arranged in the first direction X and between two sub-pixel regions SPX arranged in the second direction Y.

In embodiments, the lateral extensions 120e in the central region of the pixel PX may extend from the second surface 110F2 of the substrate 110 to a lower level than the first surface 110F1 of the substrate 110 without completely passing through the substrate 110. Accordingly, the lateral extensions 120e in the central region of the pixel PX may vertically overlap a second floating diffusion region FD2 adjacent to the first surface 110F1 of the substrate 110 in the central region of the pixel PX.

As illustrated in FIG. 3, an element isolation layer 112 defining an active region AC may be on the first surface 110F1 of the substrate 110. The element isolation layer 112 may be in an element isolation trench 112T in the first surface 110F1 of the substrate 110 to a predetermined depth, and may include an insulating material.

Pixel transistors PXT constituting a pixel circuit may be on the active region AC. Each of the pixel transistors PXT may include a source follower gate SFG, a selection gate SEL, and a reset gate RG. A ground region GND and the floating diffusion region FD may be defined in the substrate 110 by the element isolation layer 112. The ground region GND, the floating diffusion region FD, and the active region AC may be apart from one another by the element isolation layer 112.

In some embodiments, as illustrated in FIG. 2, the first sub-pixel SPX-1, the second sub-pixel SPX-2, the third sub-pixel SPX-3, and the fourth sub-pixel SPX-4 may be arranged in a matrix. In some embodiments, the first sub-pixel SPX-1 and the second sub-pixel SPX-2 may include a transmission gate TG and a source follower gate SFG, the third sub-pixel SPX-3 may include a transmission gate TG and a reset gate RG, and the fourth sub-pixel SPX-4 may include a transmission gate TG and a selection gate SEL. The figure illustrated in FIG. 2 corresponds to a layout of transistors according to some embodiments.

In embodiments, the transmission gate TG may constitute each of transmission transistors TX1, TX2, TX3, and TX4 (refer to FIG. 7), and the transmission transistors TX1, TX2, TX3, and TX4 may transmit electric charges generated by the first to fourth photoelectric conversion regions PD1, PD2, PD3, to PD4 to the floating diffusion region FD. The reset gate RG may constitute a reset transistor RX (refer to FIG. 7), and the reset transistor RX may periodically reset electric charges stored in the floating diffusion region FD. The source follower gate SFG may constitute a source follower transistor SF (refer to FIG. 7), and the source follower transistor SF may serve as a source follower buffer amplifier and may buffer a signal according to the electric charges stored in the floating diffusion region FD. The selection gate SEL may constitute a selection transistor SX (refer to FIG. 7), and the selection transistor SX may serve as a switching and addressing function for selecting the pixel PX.

Each of the pixel transistors PXT may include a gate insulating layer 142 on the first surface 110F1 of the substrate 110, a gate electrode 140 on the gate insulating layer 142, and a source/drain region SD. A spacer 144 may be on side walls of the gate electrode 140. The source/drain region SD may be in the substrate 110 on a side of the gate electrode 140.

In embodiments, the gate electrode 140 may include at least one of doped polysilicon, a metal, a metal silicide, a metal nitride, and a metal-containing layer. The gate insulating layer 142 may include silicon oxide or metal oxide. The source/drain region SD may be doped with n-type impurities.

The transmission gate TG may have a vertical buried gate structure, e.g., a dual-type buried gate structure. As the transmission gate TG has the dual type buried gate structure, an effective channel area between the substrate 110 and the transmission gate TG may increase. In embodiments, the transmission gate TG may include a first buried gate GB1, a second buried gate GB2, and a gate connection GC, and the first buried gate GB1 and the second buried gate GB2 may be apart from each other to extend toward the inside of the substrate 110 in the vertical direction Z.

As illustrated in FIG. 4, a first buried gate opening GBH1 and a second buried gate opening GBH2 may be apart from each other to extend from the first surface 110F1 of the substrate 110 to the inside of the substrate 110, and bottoms of the first buried gate opening GBH1 and the second buried gate opening GBH2 may be surrounded by a photoelectric conversion region PD. The gate insulating layer 142 may extend from the first surface 110F1 of the substrate 110 to internal walls of the first buried gate opening GBH1 and the second buried gate opening GBH2. The gate insulating layer 142 on the internal walls of the first buried gate opening GBH1 and the second buried gate opening GBH2 may be referred to as a buried gate insulating layer BGI.

The first buried gate GB1 may fill the first buried gate opening GBH1 on the buried gate insulating layer BGI, and a top surface of the first buried gate GB1 may be at a higher level than the first surface 110F1 of the substrate 110. In an implementation, the first buried gate GB1 may include a first portion P1 in the first buried gate opening GBH1, and a second portion P2 connected to the first portion P1 and having a top surface on the same plane as a top surface of the gate connection GC, and a spacer 144 may be on side walls of the second portion P2. An element having a surface "on the same plane as" another surface may mean the surfaces are coplanar or level with one another.

The second buried gate GB2 may fill the second buried gate opening GBH2 in the buried gate insulating layer BGI, and a top surface of the second buried gate GB2 may be at a higher level than the first surface 110F1 of the substrate 110. In an implementation, the second buried gate GB2 may include a first portion P3 in the second buried gate opening GBH2, and a second portion P4 connected to the first portion P3 and having a top surface on the same plane as a top surface of the gate connection GC, and a spacer 144 may be on side walls of the second portion P4.

The gate connection GC may be integrally connected to the first buried gate GB1 and the second buried gate GB2 between the first buried gate GB1 and the second buried gate GB2. In embodiments, the gate connection GC may be between the second portion P2 of the first buried gate GB1 and the second portion P2 of the second buried gate GB2, and the top surface of the gate connection GC may be at a higher level than the top surface of the first buried gate GB1 and the top surface of the second buried gate GB2. A bottom surface of the gate connection GC may be at a vertical level higher than a bottom surface of the first buried gate GB1 and a bottom surface of the second buried gate GB2, and may contact a top surface of the gate insulating layer 142.

The second portion P2 of the first buried gate GB1 may have a first width w11 in a first horizontal direction D1, the gate connection GC may have a second width w12 in the first horizontal direction D1, the second portion P4 of the second buried gate GB2 may have a third width 13w in the first horizontal direction D1, and the first width w11, the second width 12w, and the third width w13 may be substantially equal to one another. Accordingly, the first buried gate GB1, the gate connection GC, and the second buried gate GB2 may be in the form of lines extending in the second horizontal direction D2, and side walls of the first buried gate GB1, the gate connection GC, and the second buried gate GB2 may be connected to one another on the same surface (that is, on a straight line).

As the gate connection GC is integrally connected to the first buried gate GB1 and the second buried gate GB2 between the first buried gate GB1 and the second buried gate GB2, the transmission gate TG may include two portions (that is, the first portion P1 of the first buried gate GB1 and the first portion P3 of the second buried gate GB2) separate from each other at a vertical level lower than the first surface 110F1 of the substrate 110, and one portion merging (e.g., in which the first buried gate GB1 and the second buried gate GB2 are connected to each other by the gate connection GC) the first buried gate GB1 and the second buried gate GB2 at a vertical level higher than the first surface 110F1 of the substrate 110. In an implementation, it may be referred to that the transmission gate TG has a dual-type buried gate structure in that the transmission gate TG includes the two portions separate from each other at a vertical level lower than the first surface 110F1 of the substrate 110.

A spacer 144 may be on side walls of the transmission gate TG. The spacer 144 may be on the side walls of the second portion P2 of the first buried gate GB1 at a higher level than the first surface 110F1 of the substrate 110, the side walls of the second portion P4 of the second buried gate GB2 at a higher level than the first surface 110F1 of the substrate 110, and the side walls of the gate connection GC. A bottom surface of the spacer 144 may contact the top surface of the gate insulating layer 142 and may entirely surround the side walls of the transmission gate TG at a higher level than the first surface 110F1 of the substrate 110. The spacer 144 may have a first width w21 in the first horizontal direction D1, and the first width w21 may range from about 20 nm to about 50 nm.

The floating diffusion region FD may be apart from the side walls of the transmission gate TG (e.g., the side walls of the first buried gate GB1 and the second buried gate GB2) on one side of the transmission gate TG in a horizontal direction (e.g., the first horizontal direction D1 or the second horizontal direction D2 of FIG. 2).

In embodiments, the floating diffusion region FD may include a first floating diffusion region FD1 and a second floating diffusion region FD2. The second floating diffusion region FD2 may be in the central region of the pixel PX and may be shared by the first to fourth sub-pixel regions SPX-1, SPX-2, SPX-3, and SPX-4. The first floating diffusion region FD1 may be between the second floating diffusion region FD2 and the transmission gate TG. In an implementation, the first floating diffusion region FD1 in the first sub-pixel region SPX-1 may include a first portion in the form of a rectangular plane adjacent to the second floating diffusion region FD2 and extending in the first horizontal direction D1, and a second portion in the form of a trapezoidal plane adjacent to the transmission gate TG and of which the width increases as a distance between the first portion of the first floating diffusion region FD1 and the transmission gate TG may be reduced.

As illustrated in FIG. 4, the first floating diffusion region FD1 may be apart from one side wall of the first buried gate GB1 or from one side wall of the first buried gate opening GBH1 by a first distance d11 in the first horizontal direction D1 and may be apart from one side wall of the second buried gate GB2 or from one side wall of the first buried gate opening GBH1 by a second distance d12 in the first horizontal direction D1. In an implementation, the second distance d12 may be equal to the first distance d11 or may have a value close to the first distance d11 due to tolerance occurring in manufacturing processes. In embodiments, the first distance d11 and the second distance d12 may range from about 20 nm to about 50 nm.

An intrinsic semiconductor region IA planarly surrounding the first buried gate GB1 and the second buried gate GB2 may be on the substrate 110. The intrinsic semiconductor region IA may be between the transmission gate TG and the first floating diffusion region FD1. The intrinsic semiconductor region IA may not be intentionally doped or implanted with a dopant, and may include carriers (electrons and holes) in the substrate 110.

As illustrated in FIG. 6, the intrinsic semiconductor region IA may include a first region IA1 surrounding the first buried gate GB1, a second region IA2 surrounding the second buried gate GB2, and a third region IA3 between the first buried gate GB1 and the second buried gate GB2. In an implementation, the first region IA1 may vertically overlap the spacer 144 on the side walls of the first buried gate GB1, and the second region IA2 may vertically overlap the spacer 144 on the side walls of the second buried gate GB2. The third region IA3 may vertically overlap the gate connection GC and the spacer 144 on the side walls of the gate connection GC. The intrinsic semiconductor region IA may correspond to regions in which a dopant may be masked by the transmission gate TG and the spacer 144 in a process of ion-implanting a dopant into the first floating diffusion region FD1 not to be ion-implanted into the substrate 110.

The intrinsic semiconductor region IA may have a second width w22 in the first horizontal direction D1, and the second width w22 may range from about 20 nm to about 50 nm. The second width w22 of the intrinsic semiconductor region IA may be equal to the first width w21 of the spacer 144, or may have a value close to the first width w21 due to tolerance occurring in manufacturing processes.

As the side walls of the first buried gate GB1 and the second buried gate GB2 are surrounded by the intrinsic semiconductor region IA, it may be possible to prevent the side walls of the first buried gate GB1 and the second buried gate GB2 from directly contacting the first floating diffusion region FD1. Accordingly, a trap site due to a dopant, which may occur when the first floating diffusion region FD1 directly contacts the side walls of the first buried gate GB1 and the second buried gate GB2, may be prevented and generation of noise due to the trap site may be prevented.

A buried insulating layer 160 may be on the first surface 110F1 of the substrate 110. The buried insulating layer 160 may cover the ground region GND, the floating diffusion region FD, the element isolation layer 112, the gate electrode 140, and the transmission gate TG. In embodiments, the buried insulating layer 160 may include silicon nitride or silicon oxynitride.

A contact 162 passing through the buried insulating layer 160 may be on the first surface 110F1 of the substrate 110. In an implementation, the contact 162 may pass through the buried insulating layer 160 to be electrically connected to the active region ACT, the transmission gate TG, and the gate electrode 140.

In embodiments, the contact 162 may be on a top surface of the transmission gate TG. Although the contact 162 may be vertically overlapping the second buried gate GB2, the contact 162 may be on the first buried gate GB1 in other embodiments, or may be on the gate connection GC in other embodiments.

As the transmission gate TG has a dual gate structure at a lower level than the first surface 110F1 of the substrate 110 and an integrated structure in which the dual gate may be merged into one at a higher level than the first surface 110F1 of the substrate 110, it may not be necessary to form a separate contact on each of the first buried gate GB1 and the second buried gate GB2. In an implementation, because only one contact 162 may be required on the transmission gate TG according to embodiments compared to a transmission gate with a dual gate structure having two separate contacts, the parasitic capacitance between the contact 162 and the floating diffusion region FD, and the parasitic capacitance between a wiring layer 172 on the contact 162 and the floating diffusion region FD may be reduced. Accordingly, a conversion gain of the image sensor 100 may increase.

An upper wiring structure 170 may be on the buried insulating layer 160. The upper wiring structure 170 may have a stacked structure of a plurality of layers. The upper wiring structure 170 may include a wiring layer 172 and an insulating layer 174 surrounding the wiring layer 172. The wiring layer 172 may include at least one of polysilicon doped or undoped with impurities, a metal, a metal silicide, a metal nitride, and a metal-containing layer. In an implementation, the wiring layer 172 may include tungsten (W), aluminum (A1), copper (Cu), tungsten silicide, titanium silicide, tungsten nitride, titanium nitride, or doped polysilicon. The insulating layer 174 may include an insulating material such as silicon oxide, silicon nitride, or silicon oxynitride.

A back insulating layer 182 may be on the second surface 110F2 of the substrate 110. The back insulating layer 182 may be on substantially an entire area of the second surface 110F2 of the substrate 110, and may contact a top surface of the pixel element isolation layer 120 at the same level as the second surface 110F2 of the substrate 110. In embodiments, the back insulating layer 182 may include a metal oxide such as hafnium oxide, aluminum oxide, or tantalum oxide. In other embodiments, the back insulating layer 182 may include an insulating material such as silicon oxide, silicon nitride, silicon oxynitride, or a low-k dielectric material.

A passivation layer 184 may be on the back insulating layer 182, and the color filter 186 and a microlens 188 may be on the passivation layer 184. Optionally, a support substrate may be further on the first surface 110F1 of the substrate 110.

In general, as a size of the pixel PX is reduced, because a size of a mask in an ion implantation process for forming the floating diffusion region FD may be also reduced, defects are likely to occur in a mask patterning process. When the transmission gate is formed first and then the floating diffusion region FD is formed, because the floating diffusion region FD contacts an internal wall of the transmission gate trench, a trap site caused by a dopant occurs so that noise may be caused.

However, according to embodiments, the floating diffusion region FD may be formed at a position apart from the side walls of the first buried gate GB1 and the second buried gate GB2 by using the spacer 144 on the side walls of the transmission gate TG as a self-alignment mask. Accordingly, because generation of noise due to a dopant, which may occur when the floating diffusion region FD is adjacent to the side walls of the first buried gate GB1 and the second buried gate GB2, may be reduced and the number of contacts 162 and a length of the wiring layer 172 may be reduced compared to a case in which the first buried gate GB1 and the second buried gate GB2 are electrically isolated from each other, parasitic capacitance may be reduced, and thus, the conversion gain of the image sensor 100 may increase.

Figure 7:
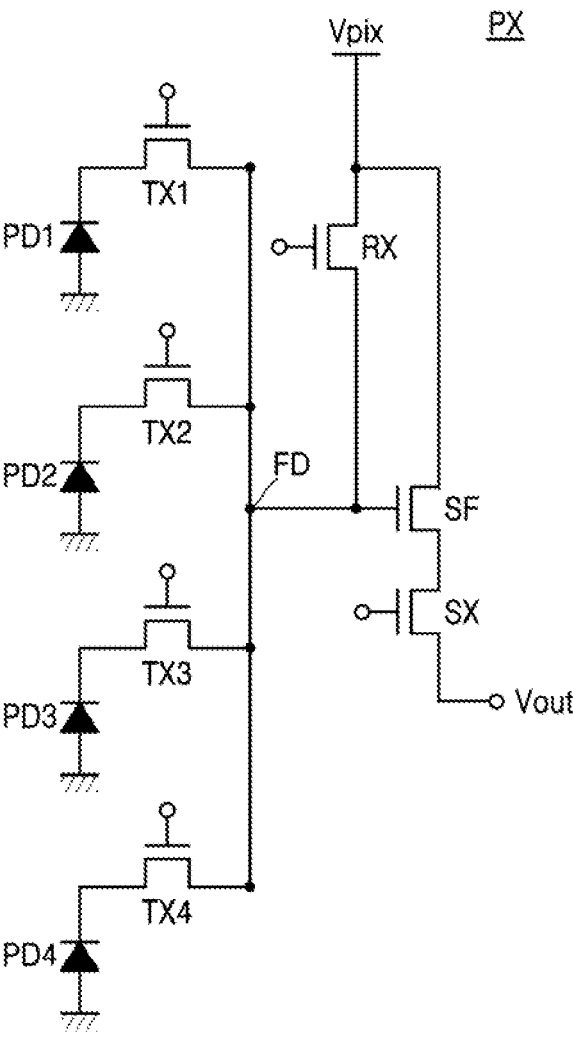
FIG. 7 is an equivalent circuit diagram of a pixel of an image sensor according to an example embodiment.

FIG. 7 is an equivalent circuit diagram of a pixel PX of an image sensor 100 according to an example embodiment. Referring to FIG. 7, a plurality of pixels PX may be arranged in a matrix. Each of the plurality of pixels PX may include transmission transistors TX1, TX2, TX3, and TX4 and logic transistors. Here, the logic transistors may include a reset transistor RX, a selection transistor SX, and a source follower transistor SF. The reset transistor RX may include a reset gate RG (refer to FIG. 2), the selection transistor SX may include a selection gate SEL (refer to FIG. 2), the source follower transistor SF may include a source follower gate SFG (refer to FIG. 2), and each of the transmission transistors TX1, TX2, TX3, and TX4 may include the transmission gate TG.

Each of the plurality of pixels PX may further include the first to fourth photoelectric conversion regions PD1, PD2, PD3, and PD4 and the floating diffusion region FD. The first to fourth photoelectric conversion regions PD1, PD2, PD3, and PD4 may generate and accumulate photocharges in proportion to an amount of light incident from the outside, and may use a photodiode, a photo transistor, a photo gate, a pinned photodiode (PPD), or a combination thereof.

The transmission gate TG may transmit electric charges generated by the first to fourth photoelectric conversion regions PD1, PD2, PD3, and PD4 to the floating diffusion region FD. The floating diffusion region FD may receive and accumulate electric charges generated by the first to fourth photoelectric conversion regions PD1, PD2, PD3, and PD4. The source follower transistor SF may be controlled according to an amount of photocharges accumulated in the floating diffusion region FD.

The reset transistor RX may periodically reset electric charges accumulated in the floating diffusion region FD. A drain electrode of the reset transistor RX may be connected to the floating diffusion region FD, and a source electrode thereof may be connected to a power supply voltage Vpix. When the reset transistor RX is turned on, the power supply voltage Vpix connected to the source electrode of the reset transistor RX may be transmitted to the floating diffusion region FD. When the reset transistor RX is turned on, electric charges accumulated in the floating diffusion region FD may be discharged to reset the floating diffusion region FD.

The source follower transistor SF may be connected to a current source located outside the plurality of pixels PX, may function as a source follower buffer amplifier, may amplify a potential change in the floating diffusion region FD, and may output the amplified potential change to an output line $V_{OUT}$.

The selection transistor SX may select the plurality of pixels PX in units of rows, and when the selection transistor SX is turned on, an output voltage generated by the source follower transistor SF is transmitted to the output line $V_{OUT}$.

Figure 8:
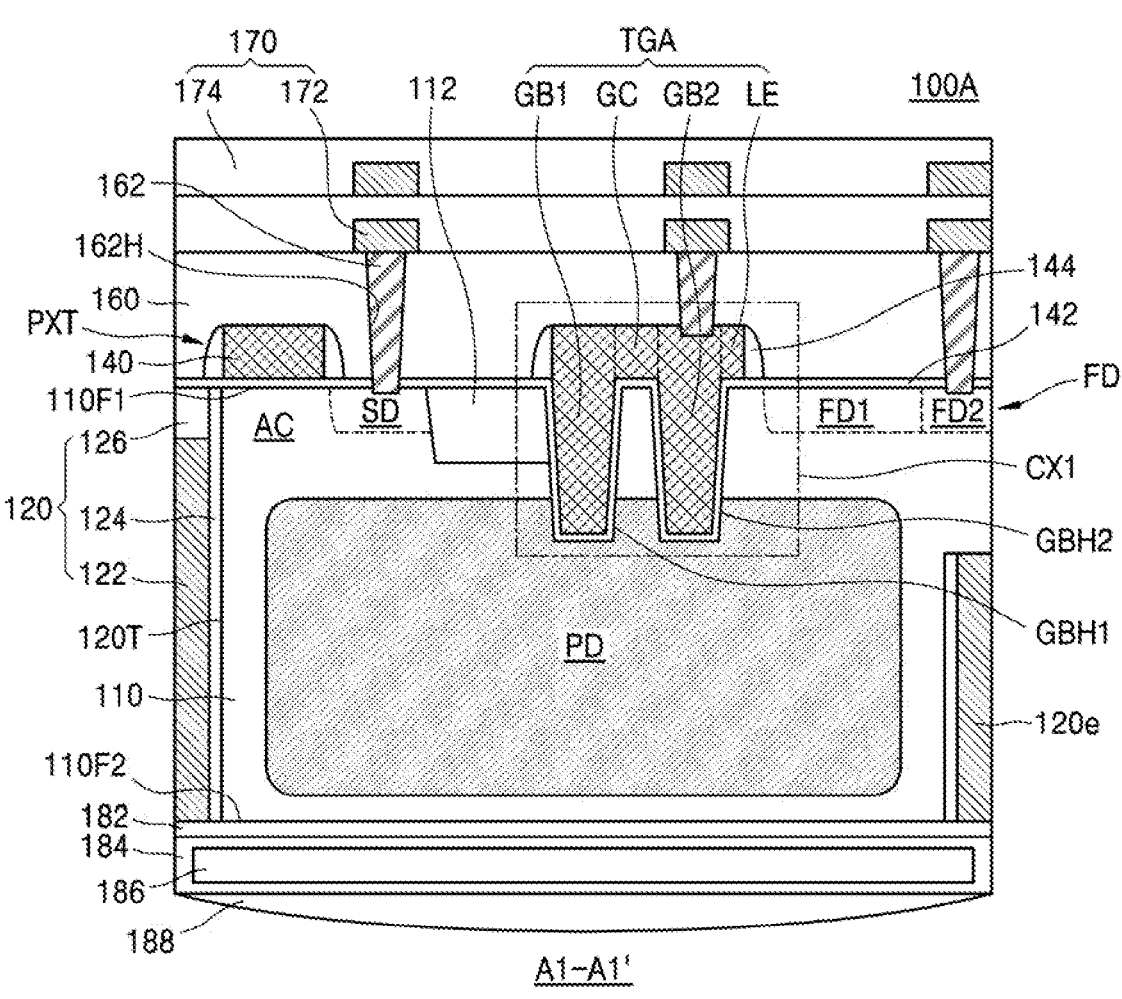
FIG. 8 is a cross-sectional view of an image sensor according to an example embodiment.
Figure 9:
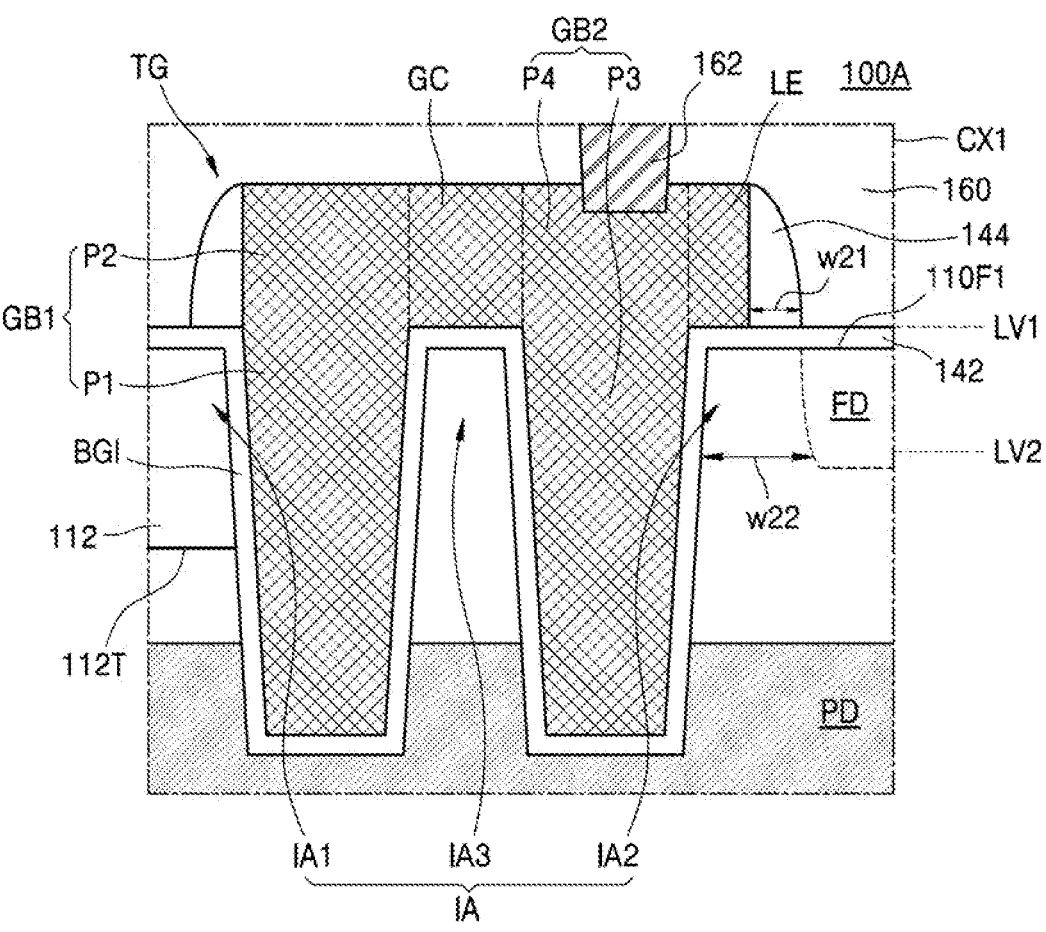
FIG. 9 is an enlarged view of the portion CX1 of FIG. 10.
Figure 10:
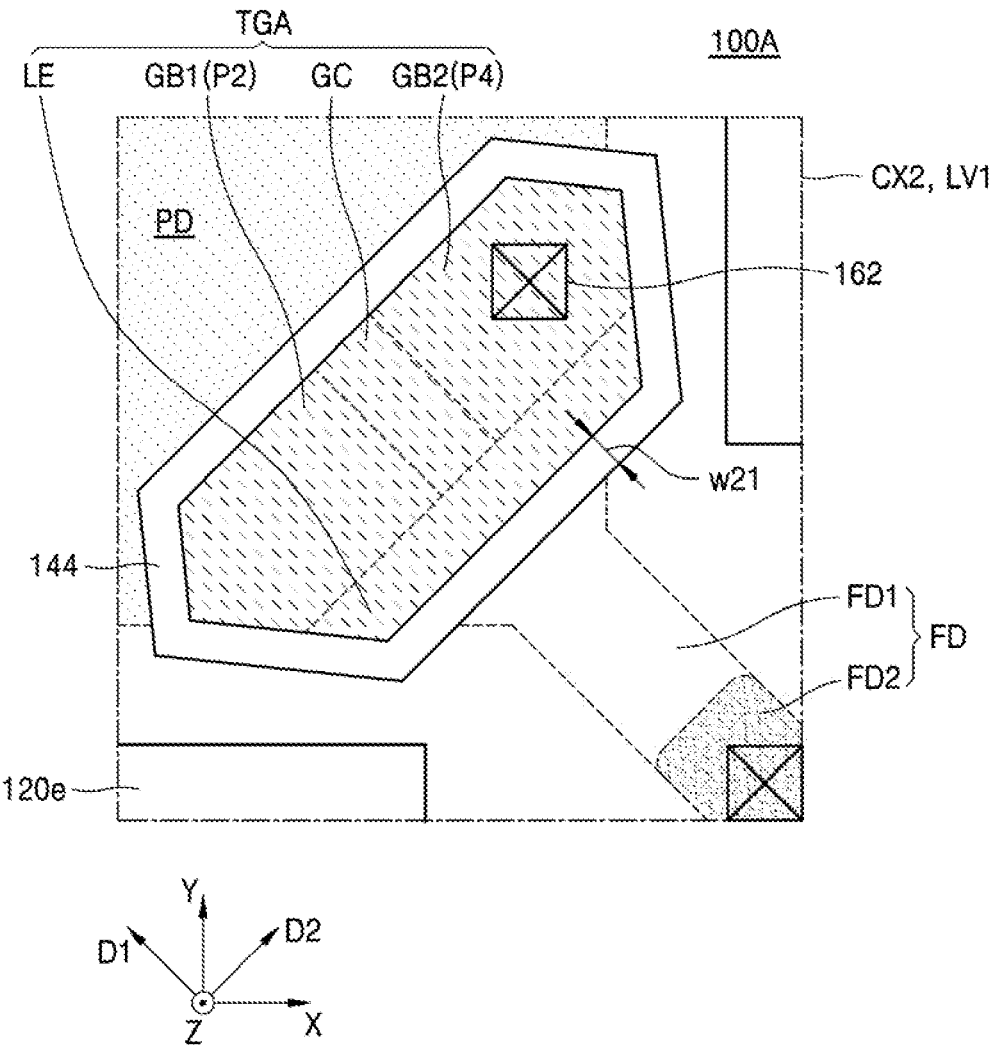
FIG. 10 is an enlarged layout diagram at the first vertical level LV1 of FIG. 9.
Figure 11:
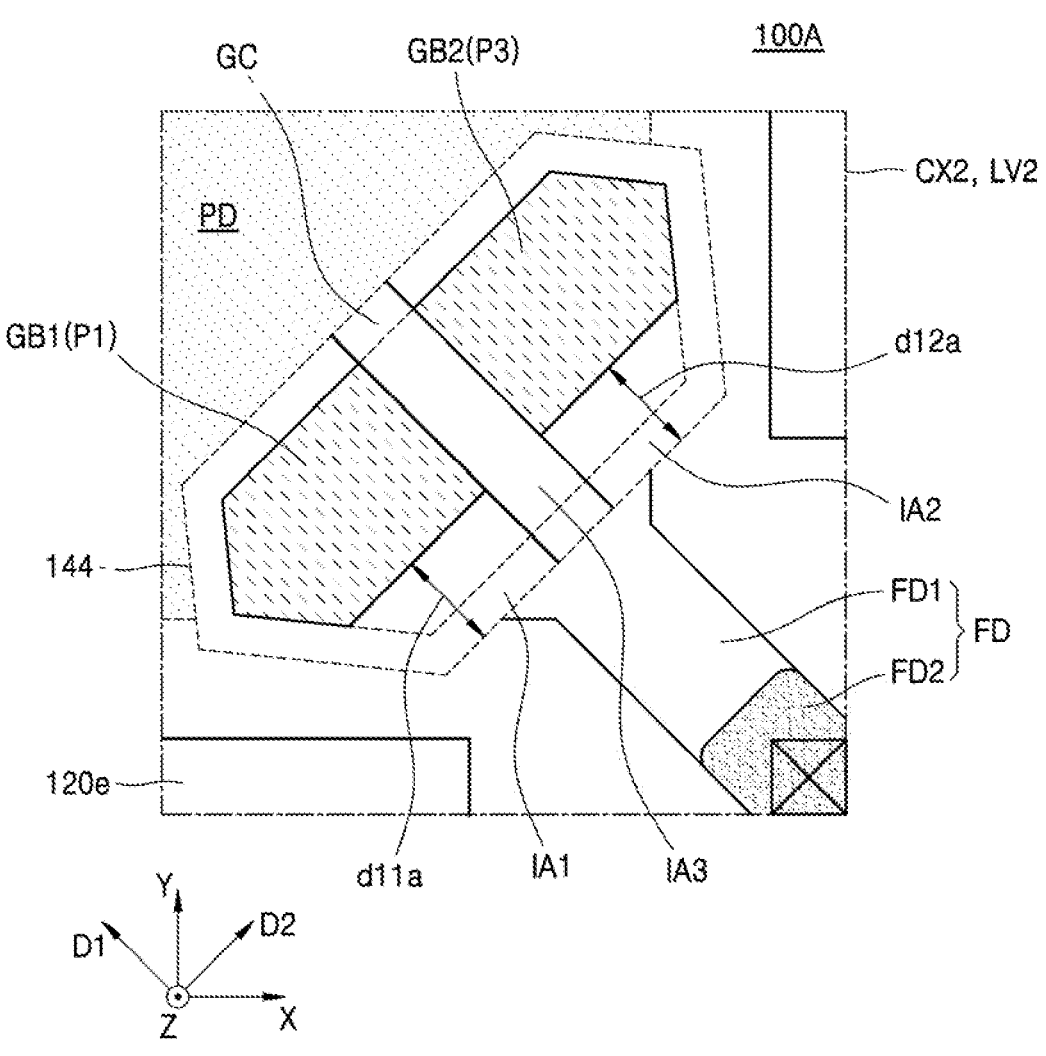
FIG. 11 is an enlarged layout diagram at the second vertical level LV2 of FIG. 9.

FIG. 8 is a cross-sectional view of an image sensor 100A according to an example embodiment, and FIG. 9 is an enlarged view of the portion CX1 of FIG. 10. FIG. 10 is an enlarged layout diagram at the first vertical level LV1 of FIG. 9, and FIG. 11 is an enlarged layout diagram at the second vertical level LV2 of FIG. 9.

Referring to FIGS. 8 to 11, a transmission gate TGA may include a first buried gate GB1, a second buried gate GB2, a gate connection GC, and a lateral extension LE. The lateral extension LE may be adjacent to the first floating diffusion region FD1 on side walls of the first buried gate GB1 and the second buried gate GB2. In an implementation, in a plan view, the lateral extension LE may extend in the second horizontal direction D2 between the first buried gate GB1 and the first floating diffusion region FD1, between the second buried gate GB2 and the first floating diffusion region FD1, and between the gate connection GC and the first floating diffusion region FD1. A side wall of the lateral extension LE may protrude toward the first floating diffusion region FD1 with respect to the side wall of the first buried gate GB1 or the second buried gate GB2.

The first floating diffusion region FD1 may be apart from one side wall of the first buried gate GB1 or from one side wall of the first buried gate opening GBH1 by a first distance d11a in the first horizontal direction D1 and may be apart from one side wall of the second buried gate GB2 or from one side wall of the first buried gate opening GBH1 by a second distance d12a in the first horizontal direction D1. In an implementation, the second distance d12a may be equal to the first distance d11a or may have a value close to the first distance d11a due to tolerance occurring in manufacturing processes. In embodiments, the first distance d11a and the second distance d12a may range from about 20 nm to about 80 nm.

The intrinsic semiconductor region IA may correspond to regions in which a dopant may be masked by the transmission gate TGA and the spacer 144 in a process of ion-implanting a dopant into the first floating diffusion region FD1 not to be ion-implanted into the substrate 110. A dopant may not be implanted into an internal region of the substrate 110, which may be covered with the lateral extension LE of the transmission gate TGA, so that the first distance d11a and the second distance d12a may be greater than the first distance d11 and the second distance d12 described with reference to FIGS. 1 to 6.

Figure 12:
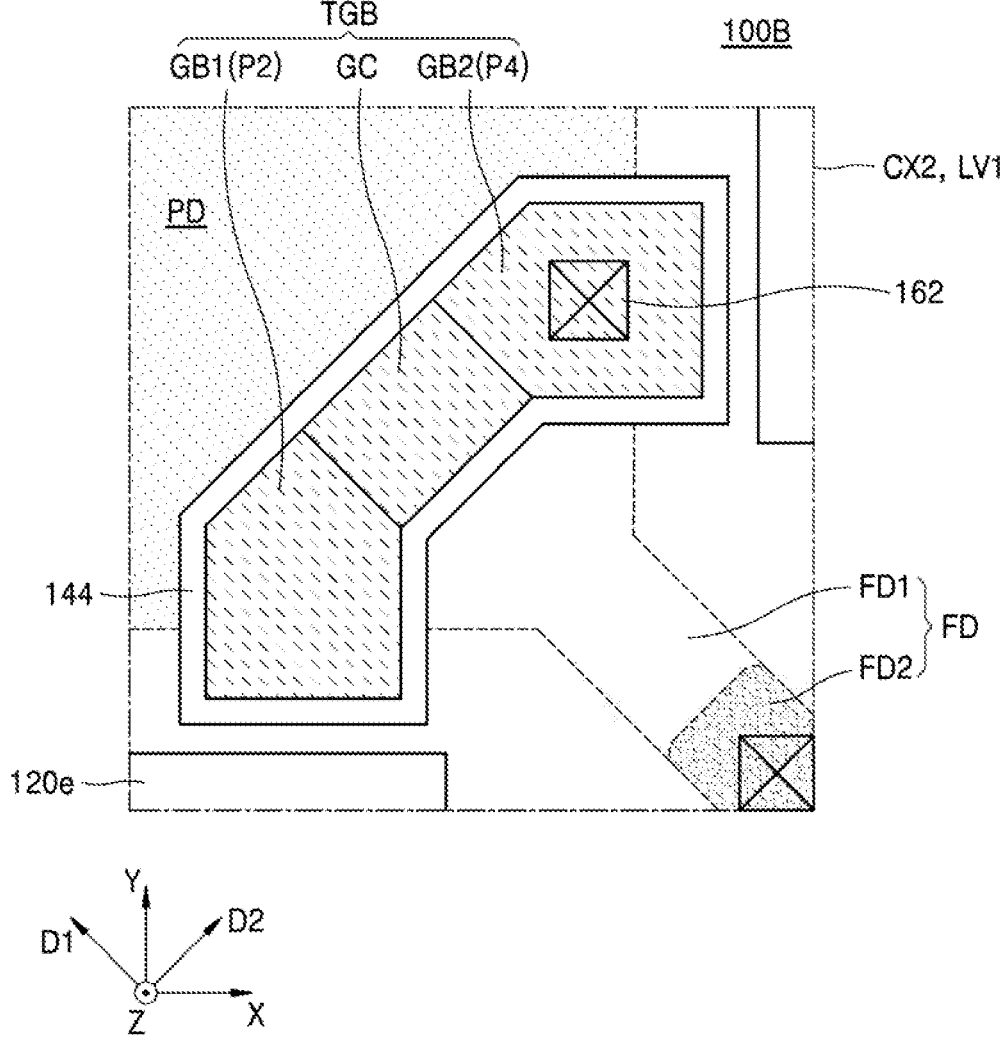
FIGS. 12 and 13 are enlarged layout diagrams of an image sensor according to an example embodiment.
Figure 13:
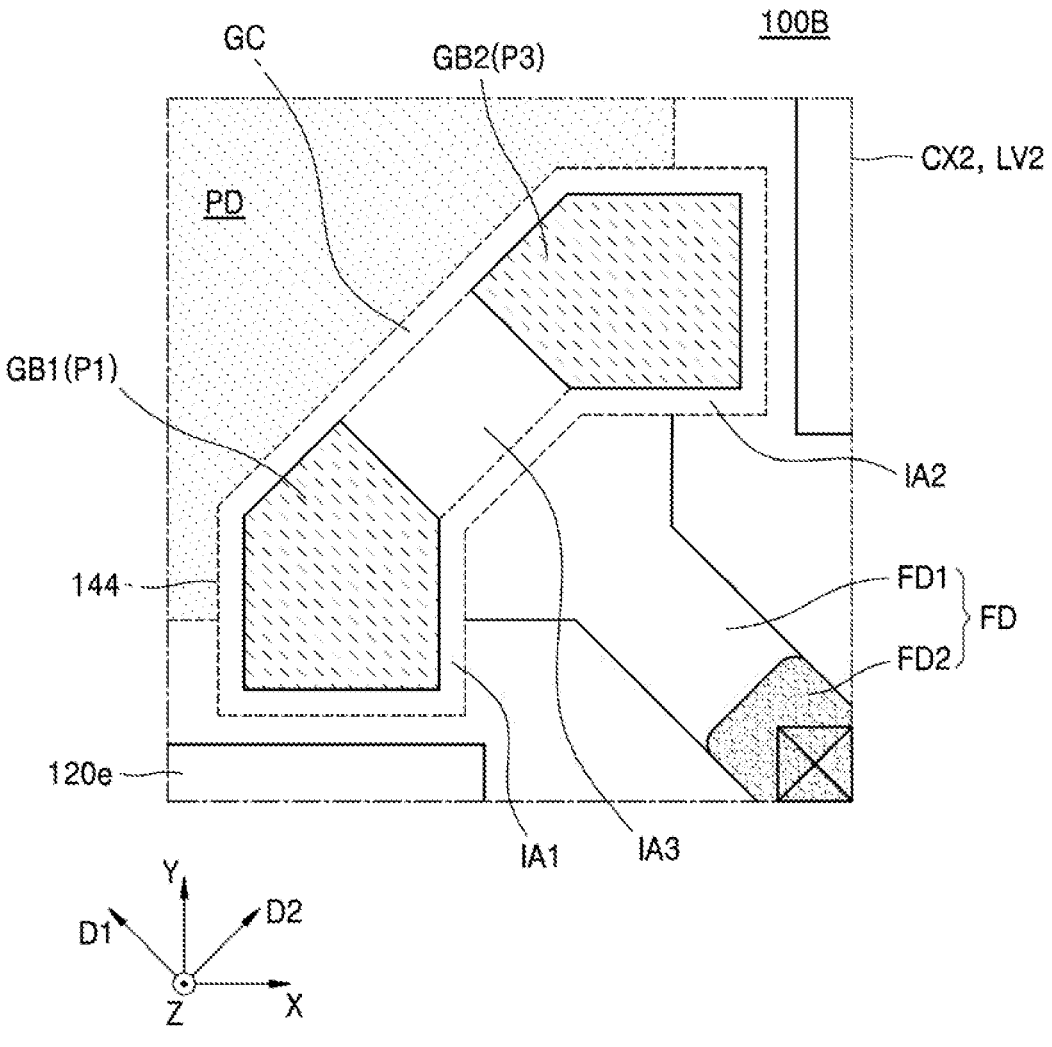

FIGS. 12 and 13 are enlarged layout diagrams of an image sensor 100B according to an example embodiment. Referring to FIGS. 12 and 13, a transmission gate TGB may have a horizontal cross-section in the form of a bent line, and a first floating diffusion region FD1 may have a horizontal cross-section along a side wall shape of the transmission gate TGB.

A side wall of a first buried gate GB1, which faces a first floating diffusion region FD1, may be connected to a side wall of a gate connection GC, which faces the first floating diffusion region FD1, at an inclined angle.

In embodiments, a width of the gate connection GC in the first horizontal direction D1 may be less than a width of the first buried gate GB1 in the first horizontal direction D1.

In other embodiments, the lateral extension LE described with reference to FIGS. 8 to 11 may be further on the side walls of the first buried gate GB1, the gate connection GC, and a second buried gate GB2, and in this case, the side wall of the lateral extension LE may protrude outward toward the first floating diffusion region FD1 with respect to the side wall of the first buried gate GB1.

Figure 14A:
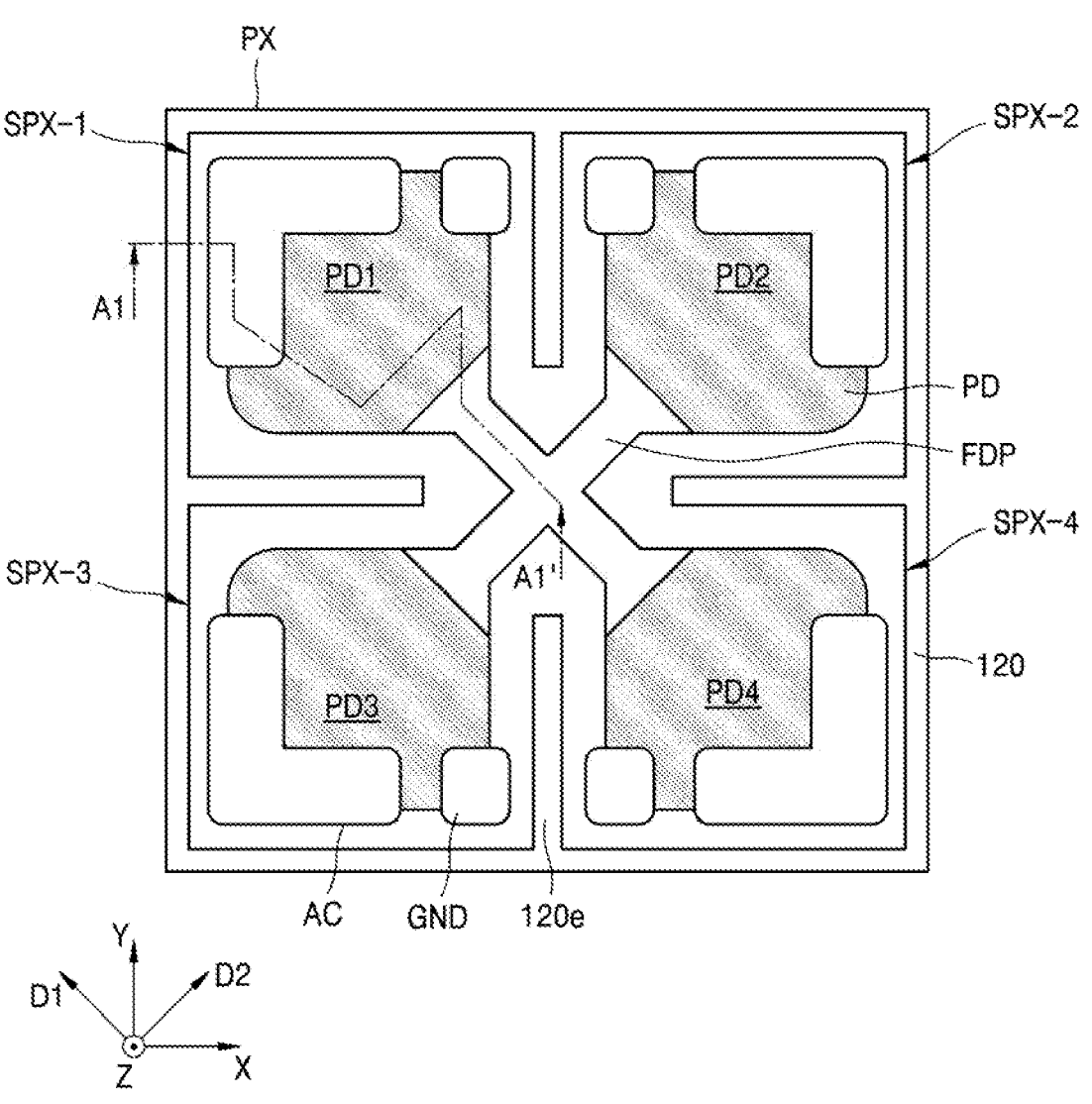
FIGS. 14A to 21 are cross-sectional views of a method of manufacturing an image sensor according to an example embodiment.

FIGS. 14A to 21 are cross-sectional views of a method of manufacturing the image sensor 100 according to an example embodiment. FIGS. 14A, 19A, and 20A are plan views of the image sensor 100 in the order of processes, and FIGS. 14B, 15 to 18, 19B, 20B, and 21 are cross-sectional views taken along line A1-A1 of FIG. 14A.

Figure 14B:
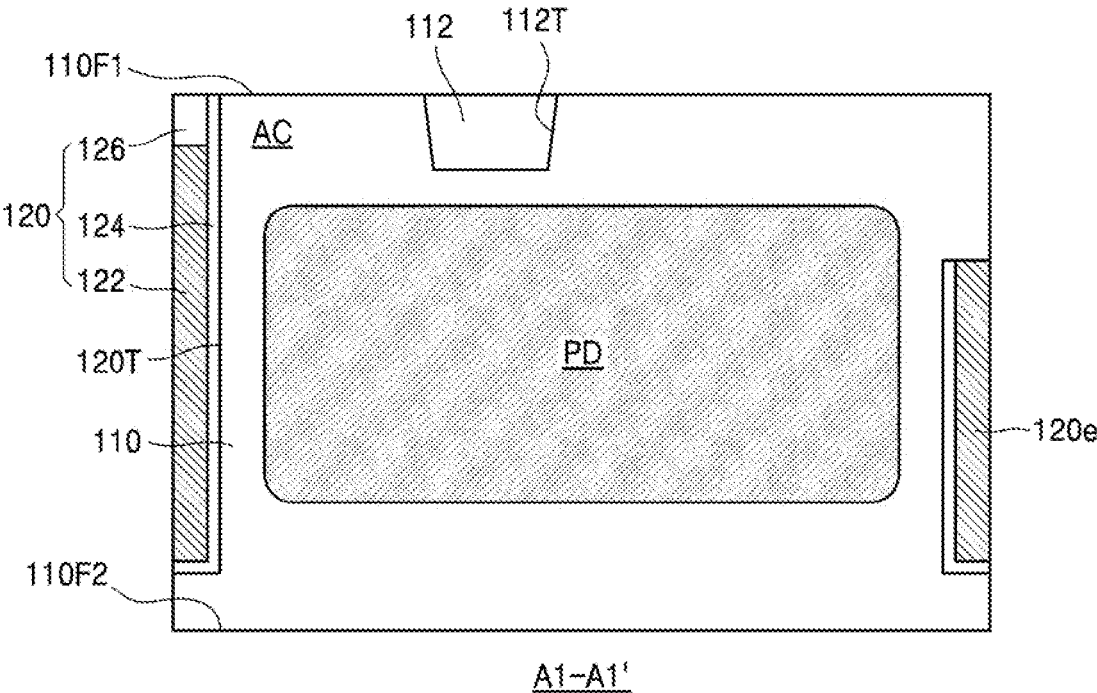

Referring to FIGS. 14A and 14B, the substrate 110 is provided. The photoelectric conversion region PD may be in the substrate 110 by the ion implantation process.

Then, the pixel element isolation layer 120 extending from the first surface 110F1 of the substrate 110 to the inside of the substrate 110 may be formed. The pixel element isolation layer 120 may include the lateral extensions 120e, and the lateral extensions 120e may not be formed from the first surface 110F1 of the substrate 110 to a predetermined height in the central region of the pixel PX.

Then, the element isolation trench 112T may be formed by partially removing the substrate 110 from the first surface 110F1 of the substrate 110, and the element isolation layer 112 may be formed by filling the element isolation trench 112T with an insulating material. An active region AC, a ground region GND, and a preliminary floating diffusion region FDP may be defined by the element isolation layer 112.

Figure 15:
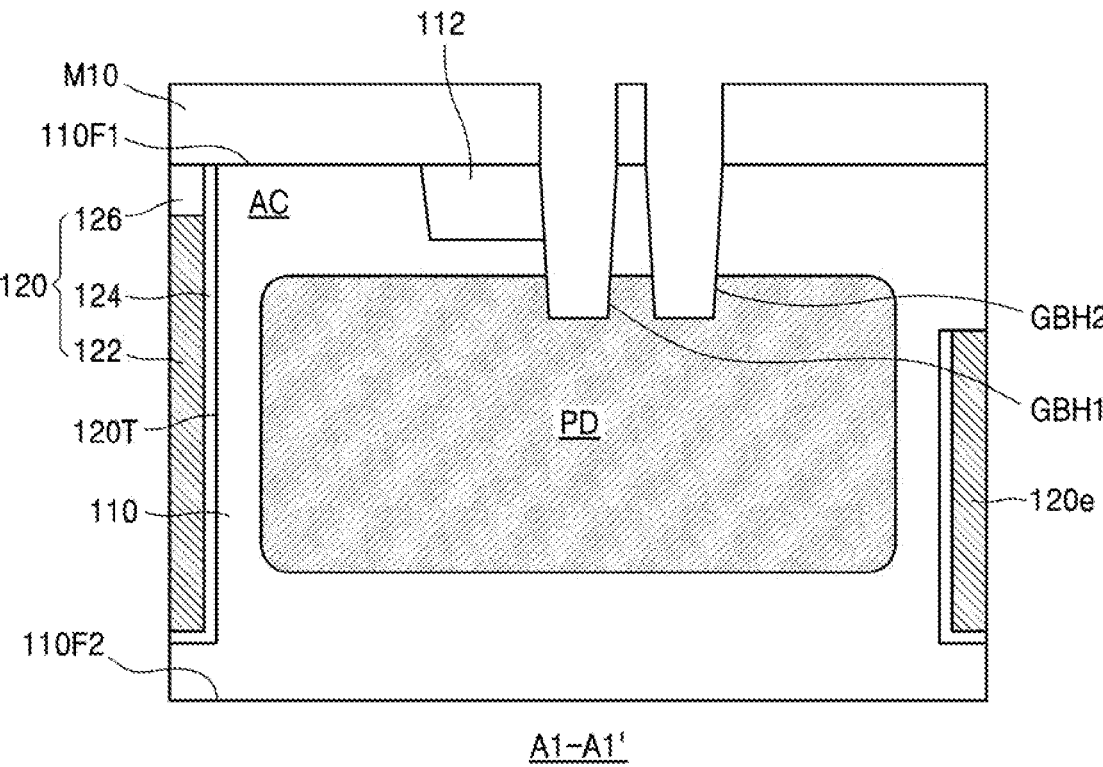

Referring to FIG. 15, a first mask M10 may be on the first surface 110F1 of the substrate 110, and the first buried gate opening GBH1 and the second buried gate opening GBH2 extending from the first surface 110F1 of the substrate 110 to the inside of the substrate 110 may be formed by using the first mask M10 as an etching mask.

The first buried gate opening GBH1 and the second buried gate opening GBH2 may be adjacent to the preliminary floating diffusion region FDP, and the bottoms of the first buried gate opening GBH1 and the second buried gate opening GBH2 may be surrounded by the photoelectric conversion region PD.

Figure 16:
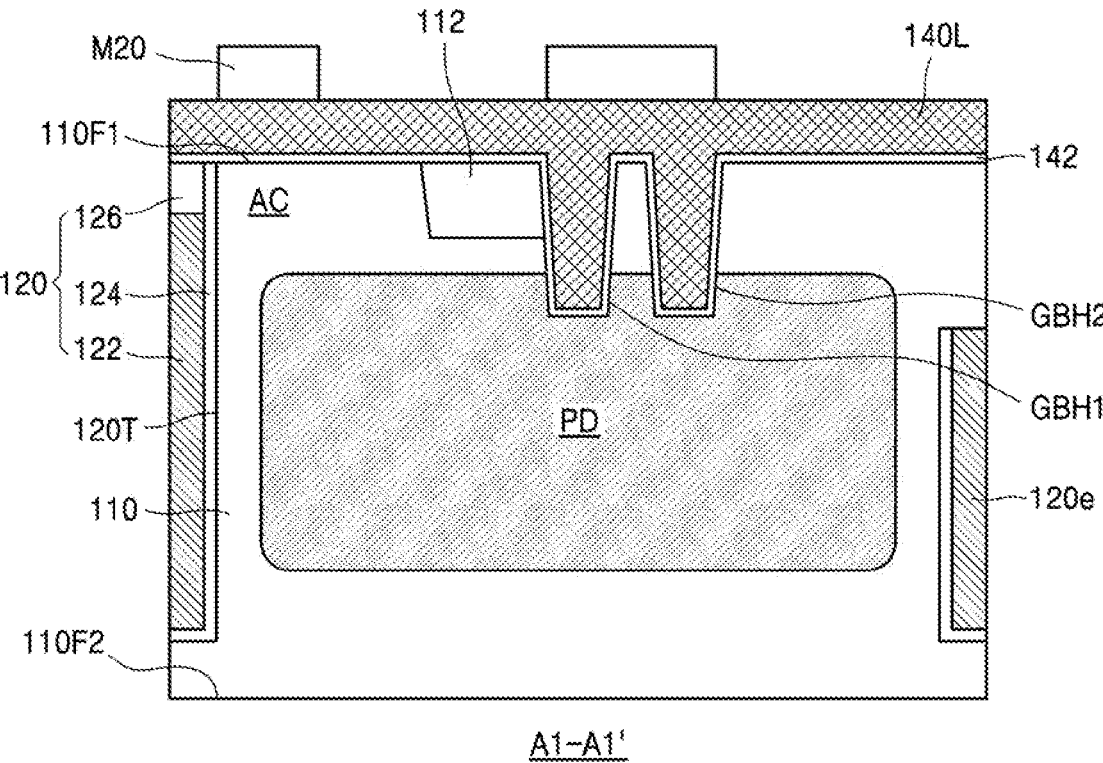

Referring to FIG. 16, the first mask M10 may be removed.

Then, the gate insulating layer 142 may be on the first surface 110F1 of the substrate 110 and on the internal walls of the first buried gate opening GBH1 and the second buried gate opening GBH2.

Then, a gate electrode layer 140L filling the first buried gate opening GBH1 and the second buried gate opening GBH2 may be on the gate insulating layer 142. The gate electrode layer 140L may be formed to a large thickness to sufficiently fill the first buried gate opening GBH1 and the second buried gate opening GBH2.

Figure 17:
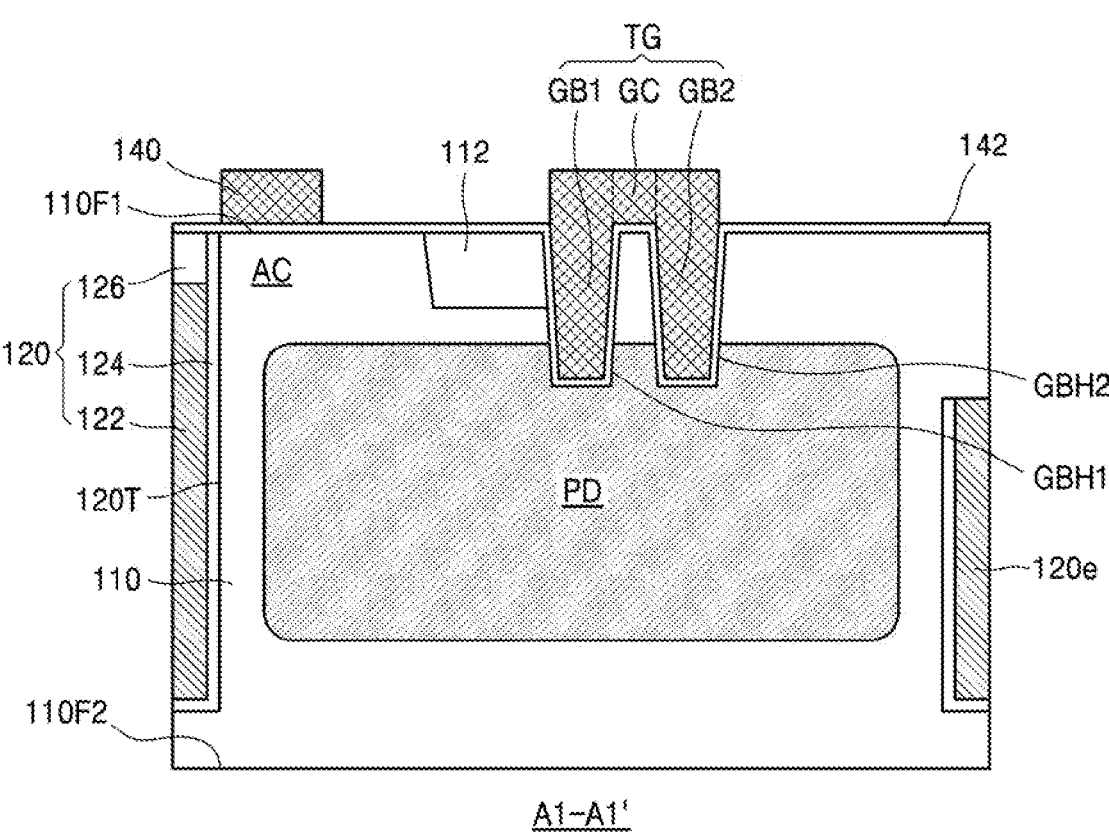

Then, a second mask M20 may be on the gate electrode layer 140L. Referring to FIG. 17, the gate electrode 140 and the transmission gate TG may be formed by patterning the gate electrode layer 140L by using the second mask M20 as an etching mask.

In embodiments, the transmission gate TG may include the first buried gate GB1 in the first buried gate opening GBH1, the second buried gate GB2 in the second buried gate opening GBH2, and the gate connection GC between the first buried gate GB1 and the second buried gate GB2 on the first surface 110F1 of the substrate 110. The first buried gate GB1 and the second buried gate GB2 may be apart from each other to extend toward the inside of the substrate 110 in the vertical direction Z.

Figure 18:
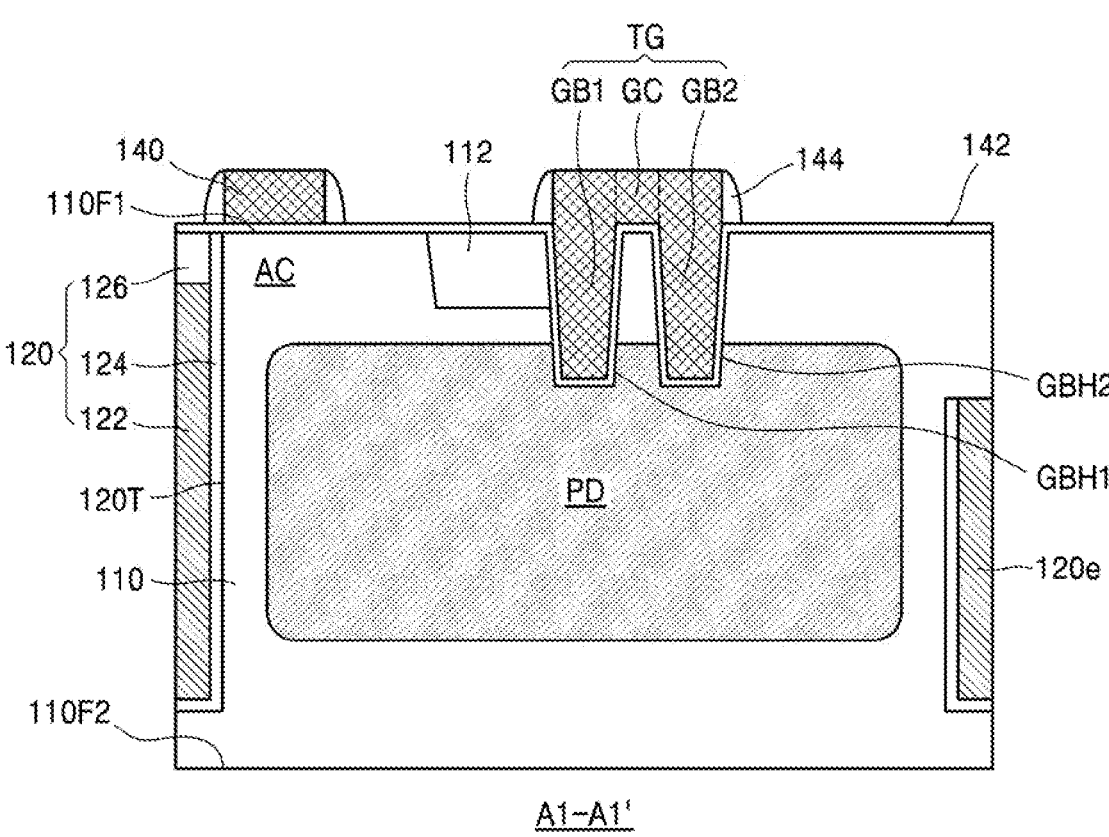

Referring to FIG. 18, an insulating layer covering the gate electrode 140 and the transmission gate TG may be on the gate insulating layer 142, and the spacer 144 may be left on the side walls of the gate electrode 140 and the side walls of the transmission gate TG by performing an anisotropic etching process on the insulating layer.

Figure 19A:
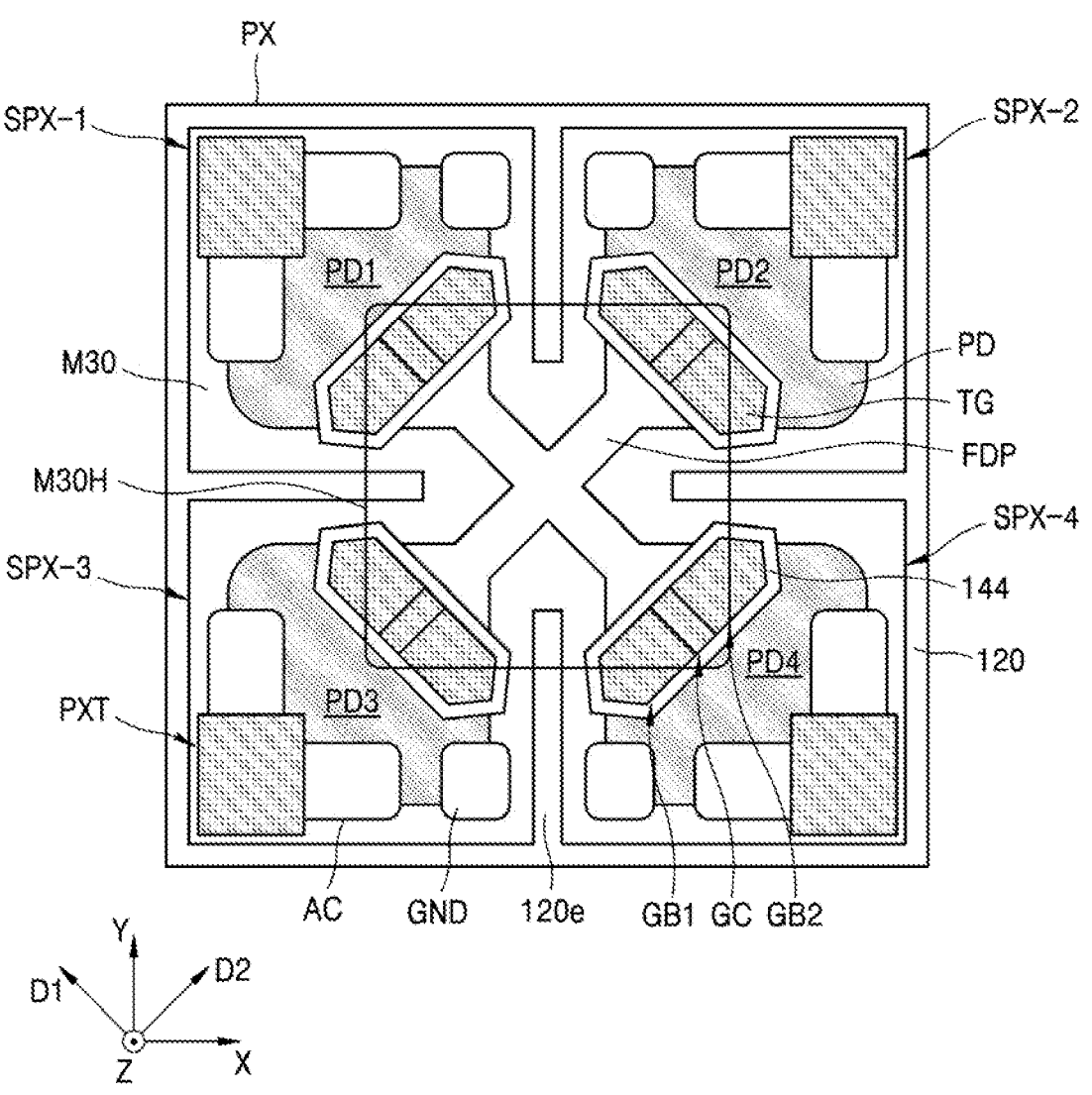
Figure 19B:
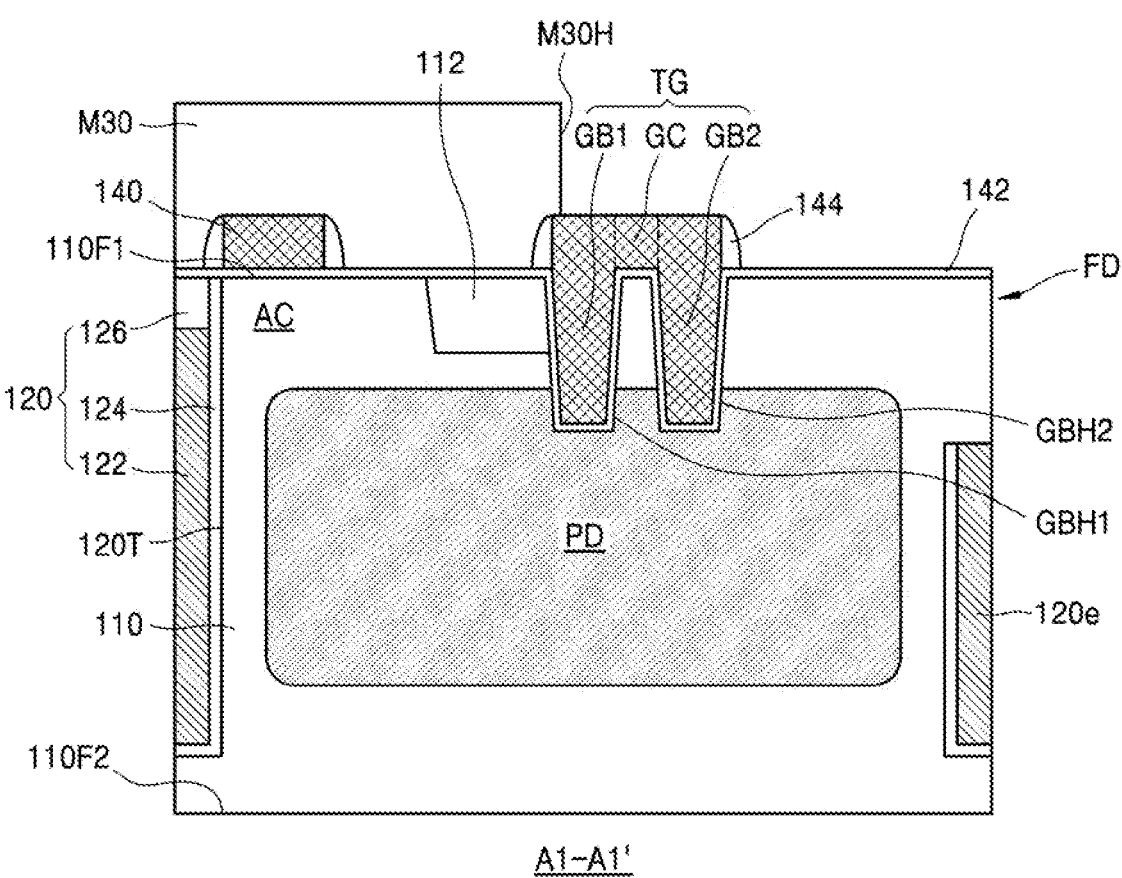

Referring to FIGS. 19A and 19B, an ion implantation mask M30 covering the gate electrode 140 and the transmission gate TG may be on the first surface 110F1 of the substrate 110. The ion implantation mask M30 may have an opening M30H exposing the central region of the pixel PX. The opening M30H may vertically overlap the plurality of transmission gates TG and spacers 144, and the preliminary floating diffusion region FDP.

Because the ion implantation mask M30 has a relatively large opening M30H, patterning defects in a process of forming the ion implantation mask M30 may be prevented.

Figure 20A:
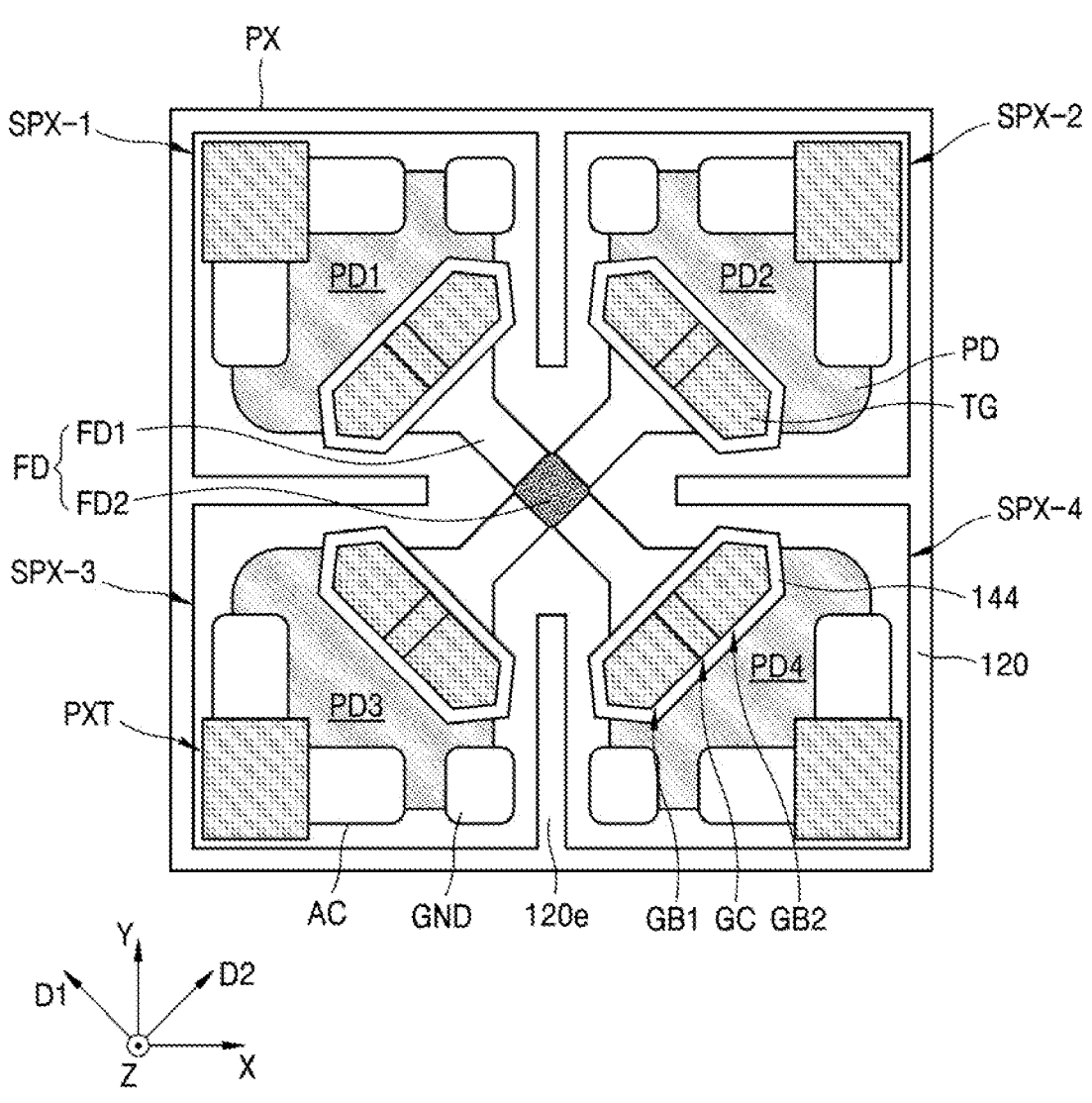
Figure 20B:
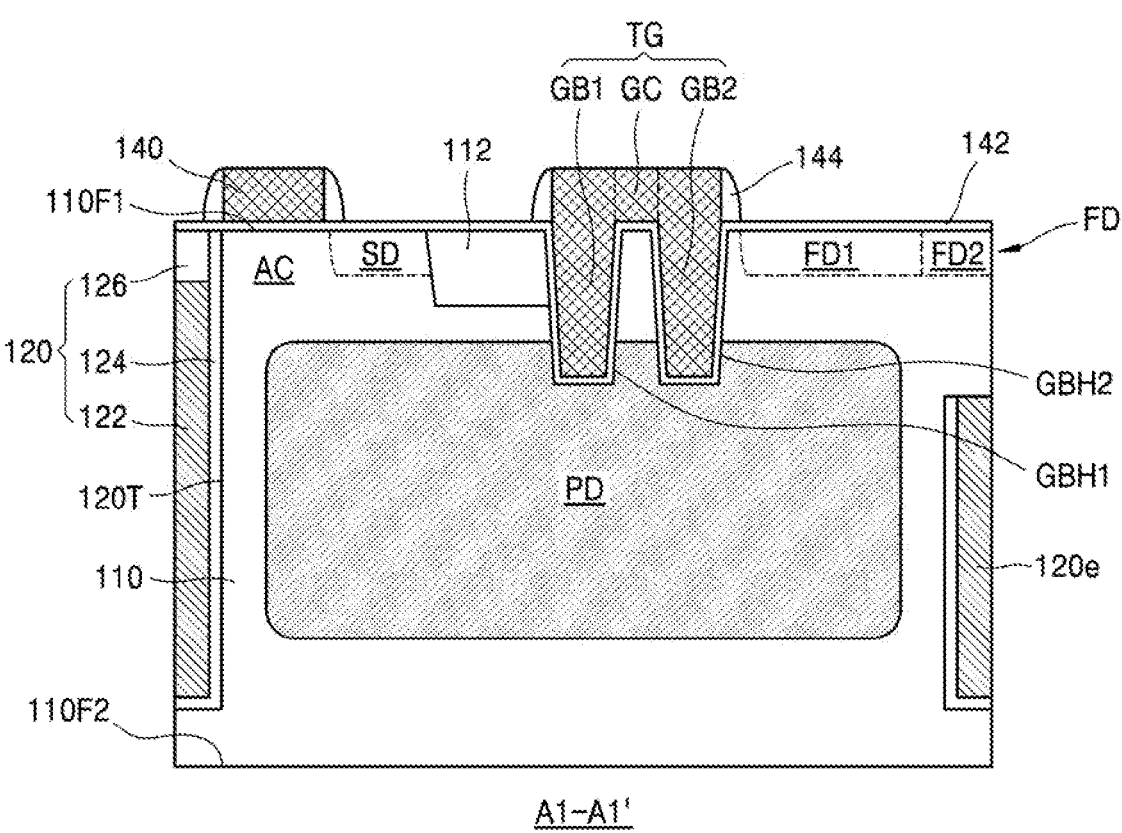

Referring to FIGS. 20A and 20B, the first and second floating diffusion regions FD1 and FD2 may be formed by implanting a dopant into a region exposed in the opening M30H of the ion implantation mask M30. The first and second floating diffusion regions FD1 and FD2 may have different dopant levels, and ion implantation processes of forming the first and second floating diffusion regions FD1 and FD2 may be sequentially performed.

According to embodiments, a dopant may not be implanted into the substrate 110 covered with the plurality of transmission gates TG and spacers 144, so that the intrinsic semiconductor regions IA may be around the plurality of transmission gates TG.

Figure 21:
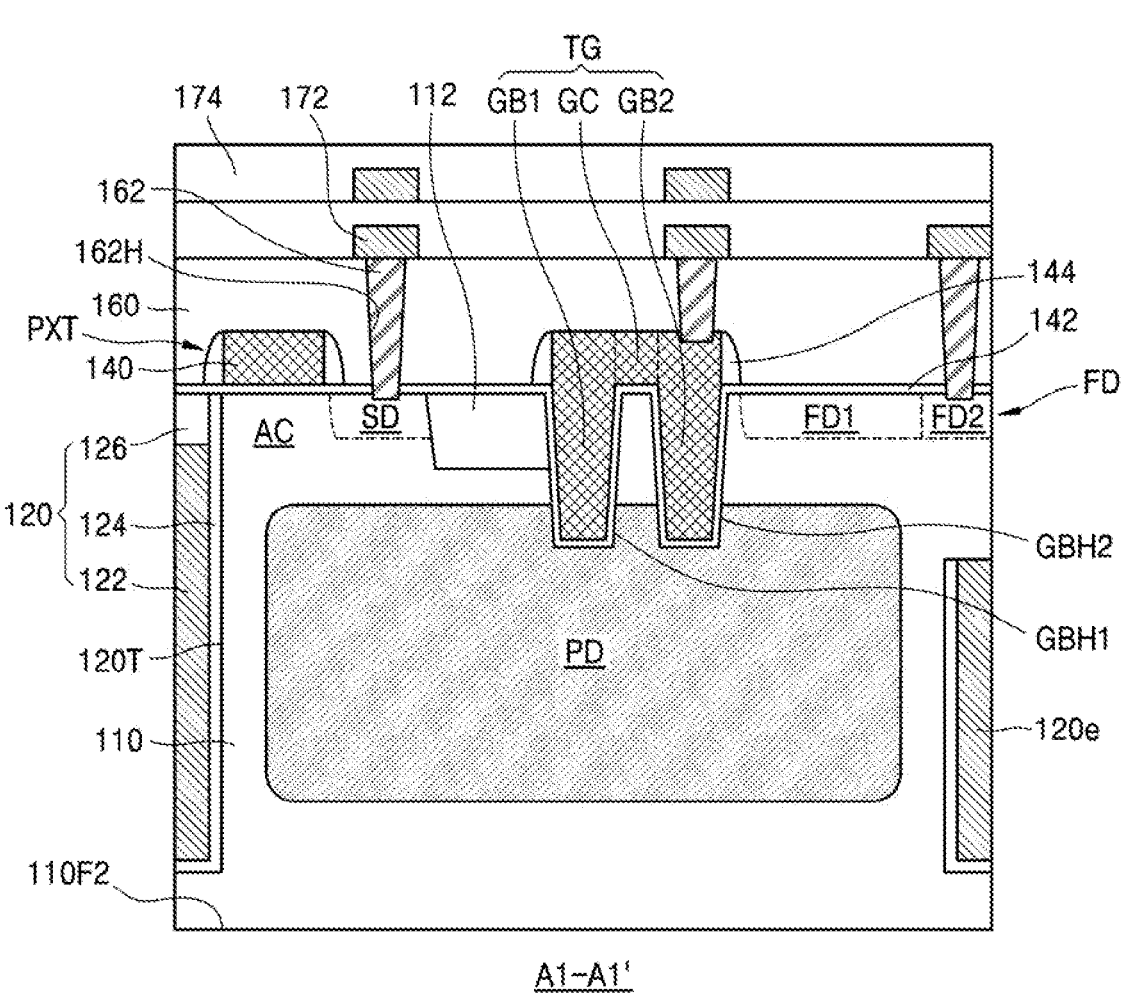

Referring to FIG. 21, the ion implantation mask M30 may be removed.

Then, the buried insulating layer 160 covering the gate electrode 140 and the transmission gate TG may be on the gate insulating layer 142. Then, the contact 162 electrically connected to the active region ACT, the transmission gate TG, and the gate electrode 140 through the buried insulating layer 160 may be formed.

Referring again to FIG. 3, a partial thickness may be removed from the second surface 110F2 of the substrate 110, the back insulating layer 182 and the passivation layer 184 may be on the second surface 110F2 of the substrate 110, and the color filter 186 and the microlens 188 may be on the passivation layer 184.

Figure 22:
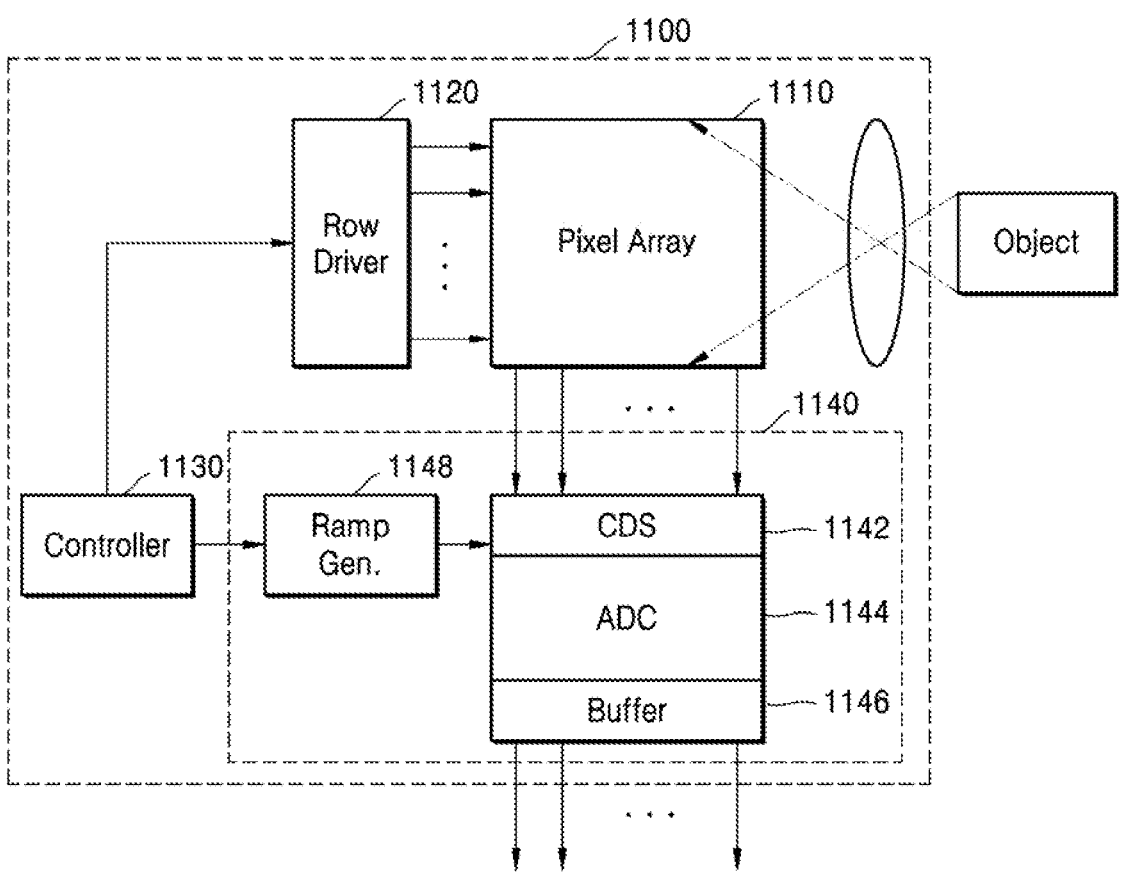
FIG. 22 is a block diagram of a configuration of an image sensor according to an example embodiment.

FIG. 22 is a block diagram of a configuration of an image sensor 1100 according to an example embodiment. Referring to FIG. 22, the image sensor 1100 may include a pixel array 1110, a controller 1130, a row driver 1120, and a pixel signal processing unit 1140. The image sensor 1100 includes at least one of the image sensors 100, 100A, and 100B described with reference to FIGS. 1 to 13.

The pixel array 1110 may include a plurality of two-dimensionally arranged unit pixels, and each unit pixel may include a photoelectric conversion element. The photoelectric conversion element may absorb light to generate electric charges, and an electrical signal (an output voltage) in accordance with the generated electric charges may be provided to the pixel signal processing unit 1140 through a vertical signal line. The unit pixels included in the pixel array 1110 may provide the output voltage one at a time in units of rows so that unit pixels belonging to one row of the pixel array 1110 may be simultaneously activated by a selection signal output by the row driver 1120. Unit pixels belonging to a selected row may provide the output voltage in accordance with absorbed light to an output line of a corresponding column.

The controller 1130 may control the row driver 1120 to allow the pixel array 1110 to absorb light to accumulate electric charges, to temporarily store the accumulated electric charges, and to output an electrical signal in accordance with the stored electric charges to the outside of the pixel array 1110. In addition, the controller 1130 may control the pixel signal processing unit 1140 to measure the output voltage provided by the pixel array 1110.

The pixel signal processing unit 1140 may include a correlated double sampler (CDS) 1142, an analog-to-digital converter (ADC) 1144, and a buffer 1146. The CDS 1142 may sample and hold the output voltage provided by the pixel array 1110. The CDS 1142 may double-sample a specific noise level and a level in accordance with the generated output voltage and may output a level corresponding to a difference between the specific noise level and the level in accordance with the generated output voltage. In addition, the CDS 1142 may receive ramp signals generated by the ramp signal generator 1148 and may compare the ramp signals with each other to output a comparison result.

The ADC 1144 may convert an analog signal corresponding to the level received from the CDS 1142 into a digital signal. The buffer 1146 may latch digital signals, and the latched digital signals may be sequentially output to the outside of the image sensor 1100 to be transmitted to an image processor.

By way of summation and review, an image sensor including a photodiode is disclosed. The image sensor has a plurality of pixels and a pixel circuit, wherein, the pixels each include a photodiode region that receives incident light and converts the received light into an electrical sign and the pixel circuit outputs a pixel signal by using electric charges generated by the photodiode region. As the degree of integration of the image sensor increases, because the size of each of the plurality of pixels is reduced and the size of each of components of the pixel circuit is also reduced, leakage current is generated by the pixel circuit so that quality of the image sensor deteriorates. An image sensor with improved image quality due to reduced read noise of a pixel circuit is disclosed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor comprising:
    a substrate having a pixel region;
    a floating diffusion region in the pixel region of the substrate;
    a plurality of photoelectric conversion regions around the floating diffusion region in the substrate;
    a plurality of transmission gates adjacent to the plurality of photoelectric conversion regions, respectively, each including a first buried gate extending to the inside of the substrate, a second buried gate apart from the first buried gate and extending to the inside of the substrate, and a gate connection between the first buried gate and the second buried gate; and
    a plurality of spacers each on at least parts of side walls of each of the plurality of transmission gates, wherein each of the plurality of spacers is between the side walls of each of the plurality of transmission gates and the floating diffusion region in a plan view.

2. The image sensor as claimed in claim 1, wherein:
    the floating diffusion region is apart from side walls of the first buried gate by a first distance in a first horizontal direction, and
    the floating diffusion region is apart from side walls of the second buried gate by a second distance in a second horizontal direction.

3. The image sensor as claimed in claim 1, further comprising an intrinsic semiconductor region in the substrate and between the floating diffusion region and each of the plurality of transmission gates and including:
    a first region between the floating diffusion region and a side wall of the first buried gate;
    a second region between the floating diffusion region and a side wall of the second buried gate; and
    a third region between the first buried gate and the second buried gate.

4. The image sensor as claimed in claim 3, wherein each of the plurality of spacers vertically overlaps the first and second regions of the intrinsic semiconductor region.

5. The image sensor as claimed in claim 3, wherein the first buried gate includes:
    a first portion in a first buried gate opening extending to the inside of the substrate; and
    a second portion connected to the first portion and having a top surface on the same plane as a top surface of the gate connection, a first portion of the spacer being on a side wall of the second portion.

6. The image sensor as claimed in claim 5, wherein:
    the first portion of the spacer has a first width in a first horizontal direction, the first region of the intrinsic semiconductor region having a second width in the first horizontal direction, and
    the first width is substantially equal to the second width.

7. The image sensor as claimed in claim 1, wherein:
    the first buried gate has a first width in a first horizontal direction,
    the gate connection has a second width in the first horizontal direction, and
    the second width is substantially equal to the first width.

8. The image sensor as claimed in claim 7, wherein a side wall of the first buried gate, which faces the floating diffusion region, is connected to a side wall of the gate connection, which faces the floating diffusion region, in a straight line.

9. The image sensor as claimed in claim 1, wherein:
    the first buried gate has a first width in a first horizontal direction,
    the gate connection has a second width in the first horizontal direction, and
    the second width is less than the first width.

10. The image sensor as claimed in claim 9, wherein a side wall of the first buried gate, which faces the floating diffusion region, is inclined with a side wall of the gate connection, which faces the floating diffusion region, at an inclined angle.

11. The image sensor as claimed in claim 1, wherein:
    each of the plurality of transmission gates further includes a lateral extension on side walls of the first buried gate, the gate connection, and the second buried gate and adjacent to the floating diffusion region, and
    a side wall of the lateral extension protrudes toward the floating diffusion region with respect to the side walls of the first buried gate.

12. An image sensor comprising:
    a substrate having a pixel region;

a floating diffusion region in the pixel region of the substrate;

a plurality of photoelectric conversion regions around the floating diffusion region in the substrate;

a plurality of transmission gates adjacent to the plurality of photoelectric conversion regions, respectively, each including a first buried gate extending to the inside of the substrate, a second buried gate apart from the first buried gate and extending to the inside of the substrate, and a gate connection between the first buried gate and the second buried gate; and a plurality of spacers each on at least parts of side walls of each of the plurality of transmission gates and each having a first width in a first horizontal direction, wherein the floating diffusion region is apart from the first buried gate by a first distance and the first distance is substantially equal to the first width.

13. The image sensor as claimed in claim 12, further comprising an intrinsic semiconductor region in the substrate and between the floating diffusion region and each of the plurality of transmission gates and including:

a first region between the floating diffusion region and a side wall of the first buried gate;

a second region between the floating diffusion region and a side wall of the second buried gate; and a third region between the first buried gate and the second buried gate.

14. The image sensor as claimed in claim 13, wherein:

each of the plurality of spacers vertically overlaps the first and second regions of the intrinsic semiconductor region, and the gate connection vertically overlaps the third region of the intrinsic semiconductor region.

15. The image sensor as claimed in claim 13, wherein the first buried gate includes:

a first portion in a first buried gate opening extending to the inside of the substrate; and a second portion connected to the first portion and having a top surface on the same plane as a top surface of the gate connection, a first portion of the spacer is on a side wall of the second portion, the first portion of the spacer has the first width in the first horizontal direction, and the first region of the intrinsic semiconductor region has a second width in the first horizontal direction and the first width is substantially equal to the second width.

16. The image sensor as claimed in claim 12, wherein a side wall of the first buried gate, which faces the floating diffusion region, is connected to a side wall of the gate connection, which faces the floating diffusion region, in a straight line.

17. The image sensor as claimed in claim 12, wherein a side wall of the first buried gate, which faces the floating diffusion region, is inclined with a side wall of the gate connection, which faces the floating diffusion region, at an inclined angle.

18. The image sensor as claimed in claim 12, wherein each of the plurality of transmission gates further includes a lateral extension on side walls of the first buried gate, the gate connection, and the second buried gate and adjacent to the floating diffusion region, and wherein a side wall of the lateral extension protrudes toward the floating diffusion region with respect to the side walls of the first buried gate.

19. An image sensor comprising:

a substrate having a pixel region;

a floating diffusion region in the pixel region of the substrate;

a plurality of photoelectric conversion regions around the floating diffusion region in the substrate;

a plurality of transmission gates adjacent to the plurality of photoelectric conversion regions, respectively, each including a first buried gate in a first buried gate opening extending to the inside of the substrate, a second buried gate apart from the first buried gate and in a second buried gate opening extending to the inside of the substrate, and a gate connection between the first buried gate and the second buried gate;

a plurality of spacers each on at least parts of side walls of each of the plurality of transmission gates; and an intrinsic semiconductor region in the substrate and between the floating diffusion region and each of the plurality of transmission gates, wherein the intrinsic semiconductor region vertically overlaps the plurality of spacers and the gate connection.

20. The image sensor as claimed in claim 19, wherein the first buried gate includes:

a first portion in the first buried gate opening; and a second portion connected to the first portion and having a top surface on the same plane as a top surface of the gate connection, on a side wall of the second portion of which a first portion of the spacer is arranged, the first portion of the spacer has a first width in a first horizontal direction, a first region of the intrinsic semiconductor region surrounding the first buried gate has a second width in the first horizontal direction, and the first width is substantially equal to the second width.

* * * * *